United States Patent
Utomo et al.

(10) Patent No.: US 10,242,980 B2
(45) Date of Patent: Mar. 26, 2019

(54) SEMICONDUCTOR FIN ISOLATION BY A WELL TRAPPING FIN PORTION

(71) Applicant: International Business Machines Corporation, Armonk, NY (US)

(72) Inventors: Henry K. Utomo, Newburgh, NY (US); Kangguo Cheng, Schenectady, NY (US); Ramachandra Divakaruni, Ossining, NY (US); Ravikumar Ramachandran, Pleasantville, NY (US); Huiling Shang, Yorktown Heights, NY (US); Reinaldo A. Vega, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/331,351

(22) Filed: Oct. 21, 2016

(65) Prior Publication Data

US 2017/0040320 A1     Feb. 9, 2017

Related U.S. Application Data

(60) Continuation of application No. 14/510,650, filed on Oct. 9, 2014, now Pat. No. 9,496,258, which is a
(Continued)

(51) Int. Cl.
    *H01L 27/088*      (2006.01)
    *H01L 29/78*       (2006.01)
(Continued)

(52) U.S. Cl.
CPC .. *H01L 27/0886* (2013.01); *H01L 21/823431* (2013.01); *H01L 21/823821* (2013.01);
(Continued)

(58) Field of Classification Search
CPC ............. H01L 27/0886; H01L 27/0924; H01L 21/823821; H01L 29/161; H01L 29/0649;
(Continued)

(56) References Cited

U.S. PATENT DOCUMENTS 5,786,251 A *   7/1998   Harris ................. H01L 29/1608
                                                            257/E21.066
6,967,175 B1     11/2005   Ahmed et al.
(Continued)

*Primary Examiner* — Marc Armand
*Assistant Examiner* — Sue Tang
(74) *Attorney, Agent, or Firm* — Scully, Scott, Murphy & Presser, P.C.; Steven J. Meyers

(57) ABSTRACT

A bulk semiconductor substrate including a first semiconductor material is provided. A well trapping layer including a second semiconductor material and a dopant is formed on a top surface of the bulk semiconductor substrate. The combination of the second semiconductor material and the dopant within the well trapping layer is selected such that diffusion of the dopant is limited within the well trapping layer. A device semiconductor material layer including a third semiconductor material can be epitaxially grown on the top surface of the well trapping layer. The device semiconductor material layer, the well trapping layer, and an upper portion of the bulk semiconductor substrate are patterned to form at least one semiconductor fin. Semiconductor devices formed in each semiconductor fin can be electrically isolated from the bulk semiconductor substrate by the remaining portions of the well trapping layer.

14 Claims, 16 Drawing Sheets

Related U.S. Application Data division of application No. 13/792,797, filed on Mar. 11, 2013, now Pat. No. 8,933,528.

(51) Int. Cl.

| | |
|---|---|
| *H01L 29/66* | (2006.01) |
| *H01L 29/06* | (2006.01) |
| *H01L 29/16* | (2006.01) |
| *H01L 29/161* | (2006.01) |
| *H01L 29/165* | (2006.01) |
| *H01L 29/167* | (2006.01) |
| *H01L 21/8238* | (2006.01) |
| *H01L 27/092* | (2006.01) |
| *H01L 21/8234* | (2006.01) |
| *H01L 29/08* | (2006.01) |
| *H01L 29/10* | (2006.01) |

(52) U.S. Cl.
CPC ...... *H01L 27/0924* (2013.01); *H01L 29/0649* (2013.01); *H01L 29/0847* (2013.01); *H01L 29/1095* (2013.01); *H01L 29/161* (2013.01); *H01L 29/165* (2013.01); *H01L 29/167* (2013.01); *H01L 29/1608* (2013.01); *H01L 29/66795* (2013.01); *H01L 29/785* (2013.01); *H01L 29/7849* (2013.01)

(58) Field of Classification Search
CPC . H01L 29/1608; H01L 29/167; H01L 29/165; H01L 29/7849; H01L 29/785; H01L 29/66795

USPC ......................................................... 257/770
See application file for complete search history.

(56) References Cited

U.S. PATENT DOCUMENTS

| | | | |
|---|---|---|---|
| 6,995,397 B2* | 2/2006 | Yamashita | ............ H01L 29/105 |
| | | | 257/192 |
| 8,476,706 B1* | 7/2013 | Chidambarrao | .... H01L 21/8238 |
| | | | 257/338 |
| 8,642,996 B2* | 2/2014 | Cohen | .................... B82Y 10/00 |
| | | | 257/27 |
| 8,674,449 B2 | 2/2014 | Zhu et al. | |
| 8,889,495 B2* | 11/2014 | Cheng | ..................... H01L 29/16 |
| | | | 438/149 |
| 2004/0256647 A1 | 12/2004 | Lee et al. | |
| 2005/0130358 A1 | 6/2005 | Chidambarrao et al. | |
| 2009/0267155 A1* | 10/2009 | Izumida | .............. H01L 29/1054 |
| | | | 257/365 |
| 2009/0294800 A1* | 12/2009 | Cheng | ............... H01L 21/82341 |
| | | | 257/192 |
| 2011/0230039 A1 | 9/2011 | Mowry et al. | |
| 2012/0104514 A1* | 5/2012 | Park | .................. H01L 21/28518 |
| | | | 257/411 |
| 2013/0168771 A1 | 7/2013 | Wu et al. | |
| 2013/0277795 A1* | 10/2013 | Assefa | ............. H01L 21/76232 |
| | | | 257/506 |

\* cited by examiner

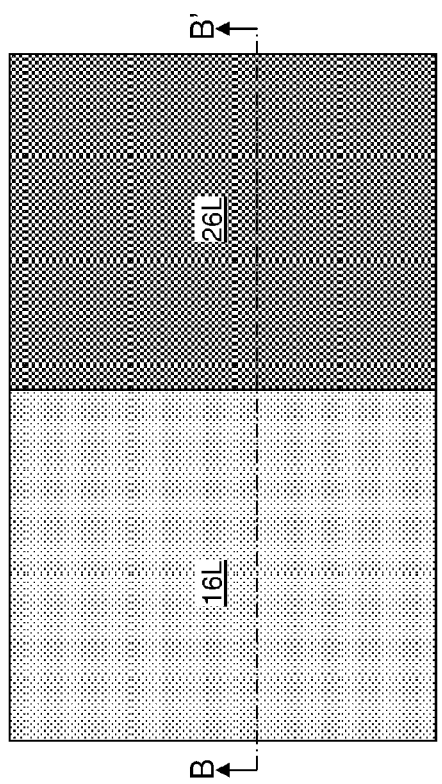
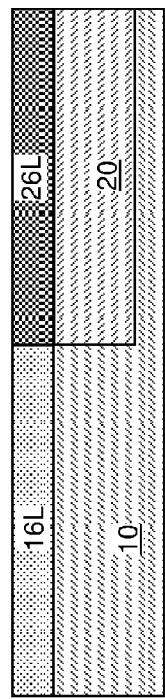
FIG. 2A
FIG. 2B

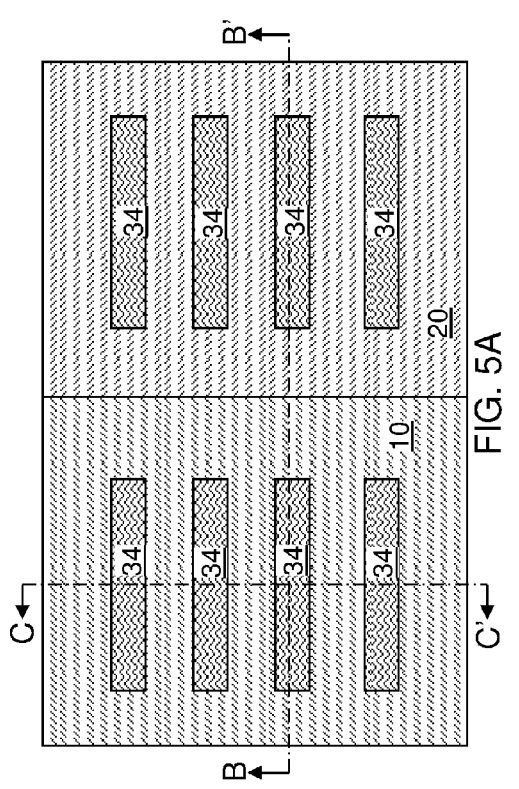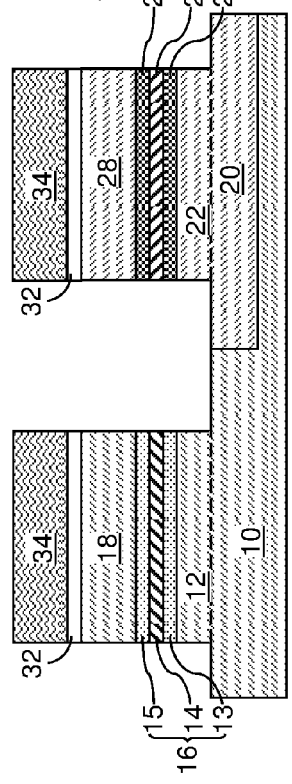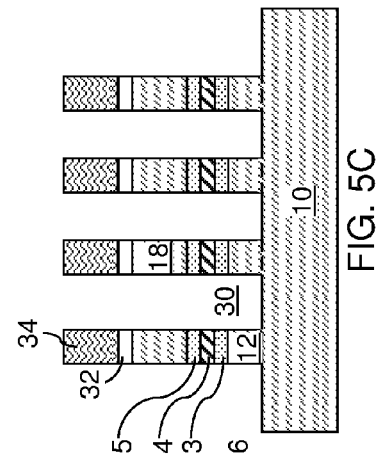
FIG. 5A
FIG. 5B
FIG. 5C

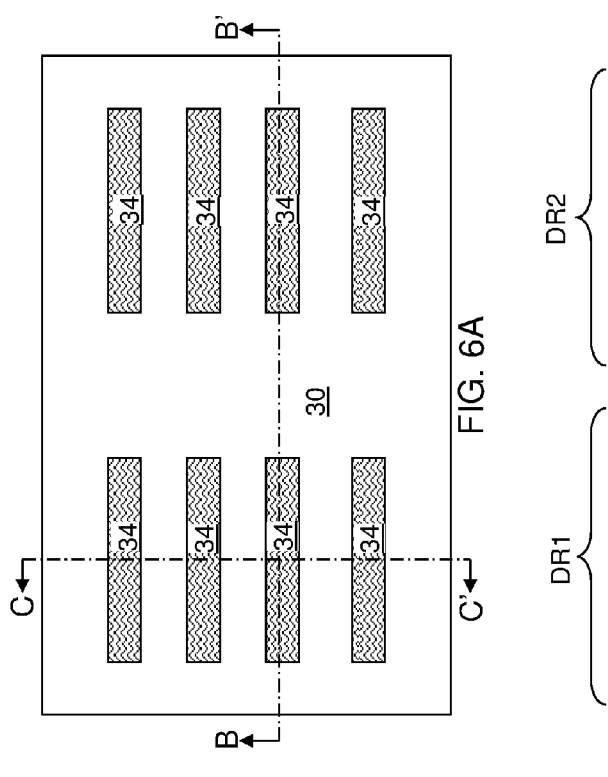
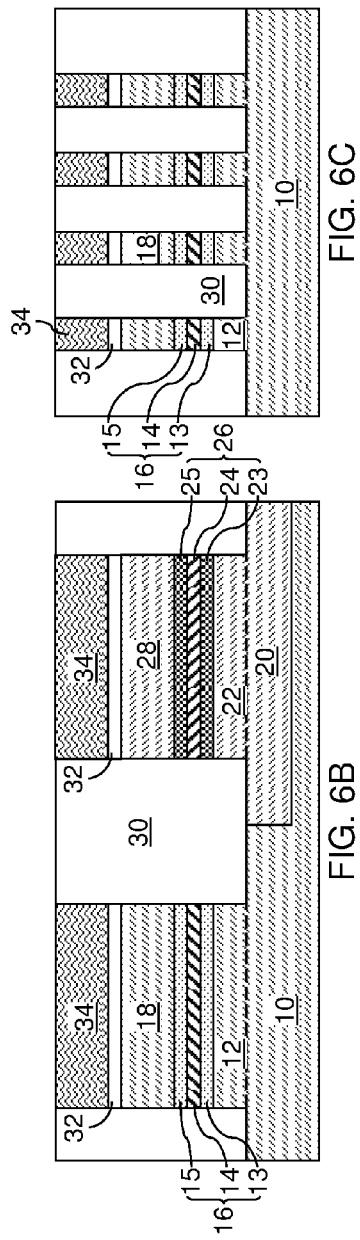
FIG. 6A
FIG. 6B
FIG. 6C

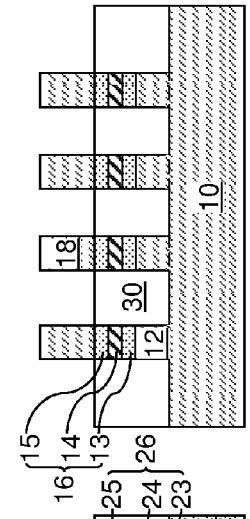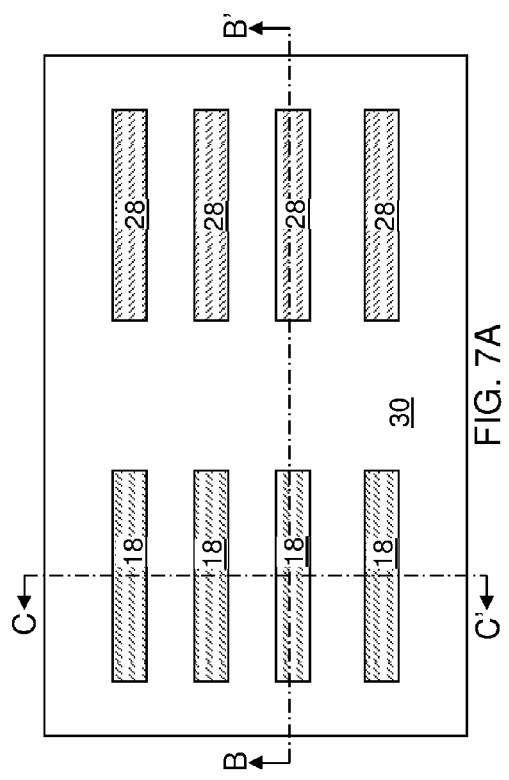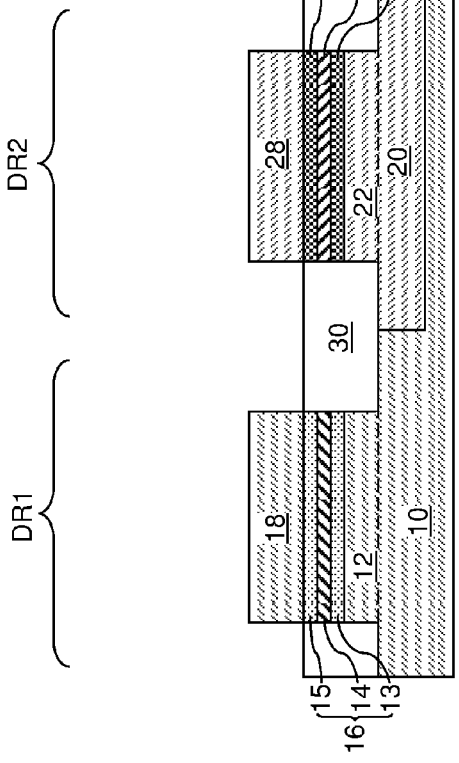

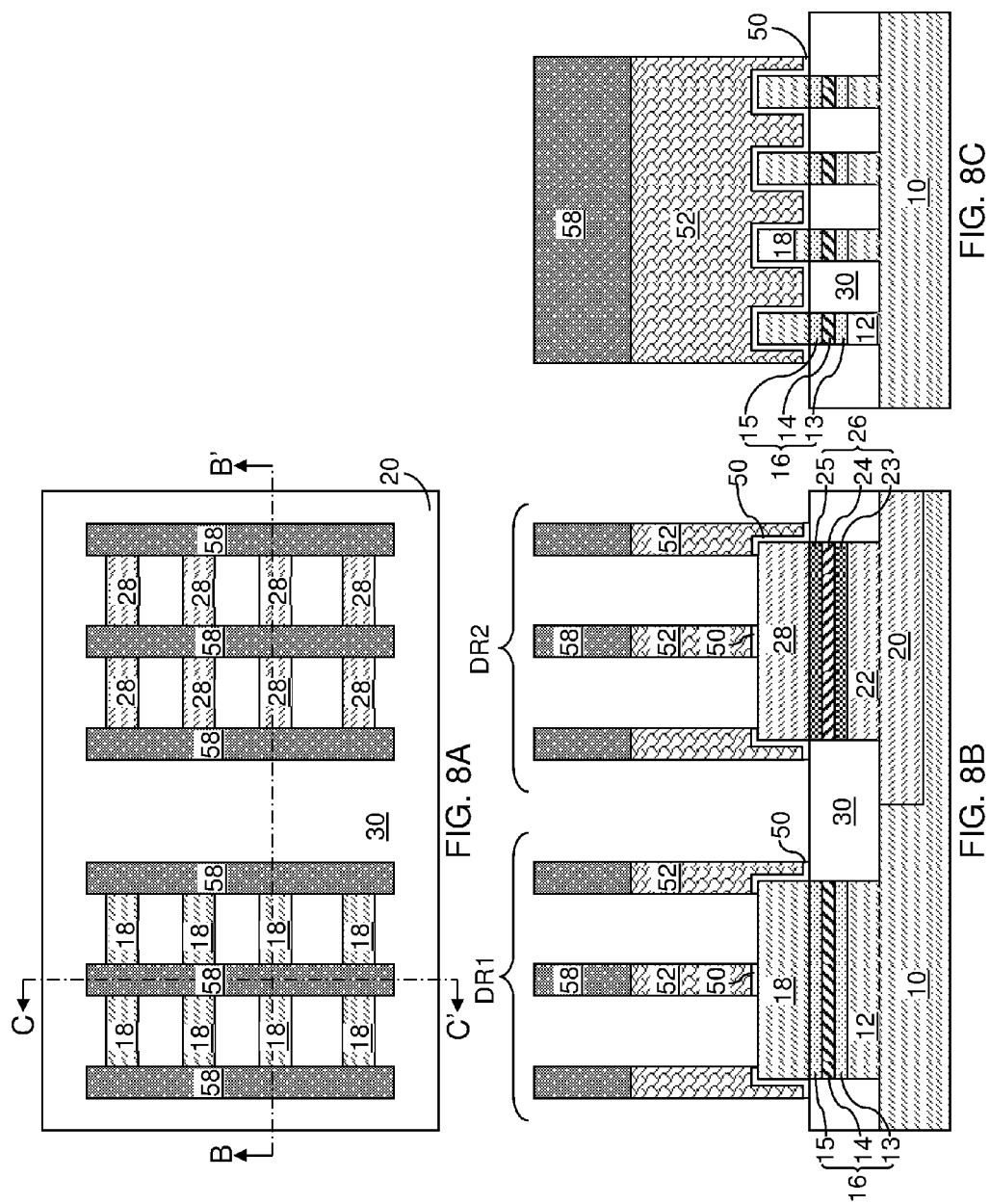

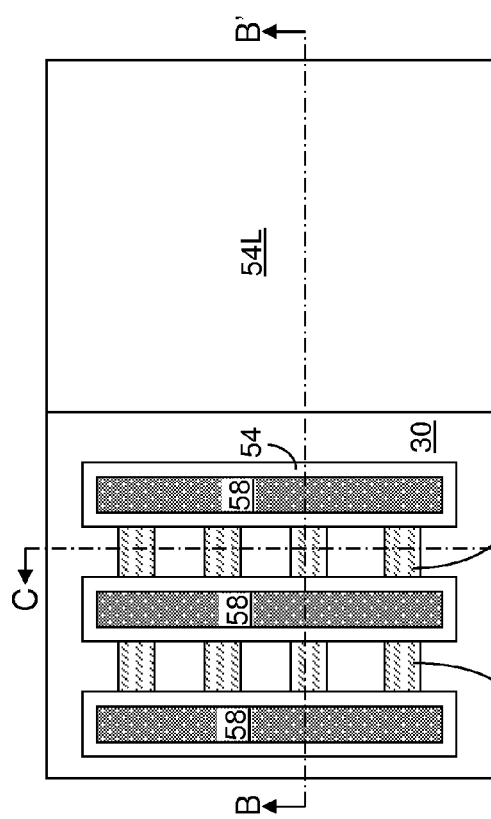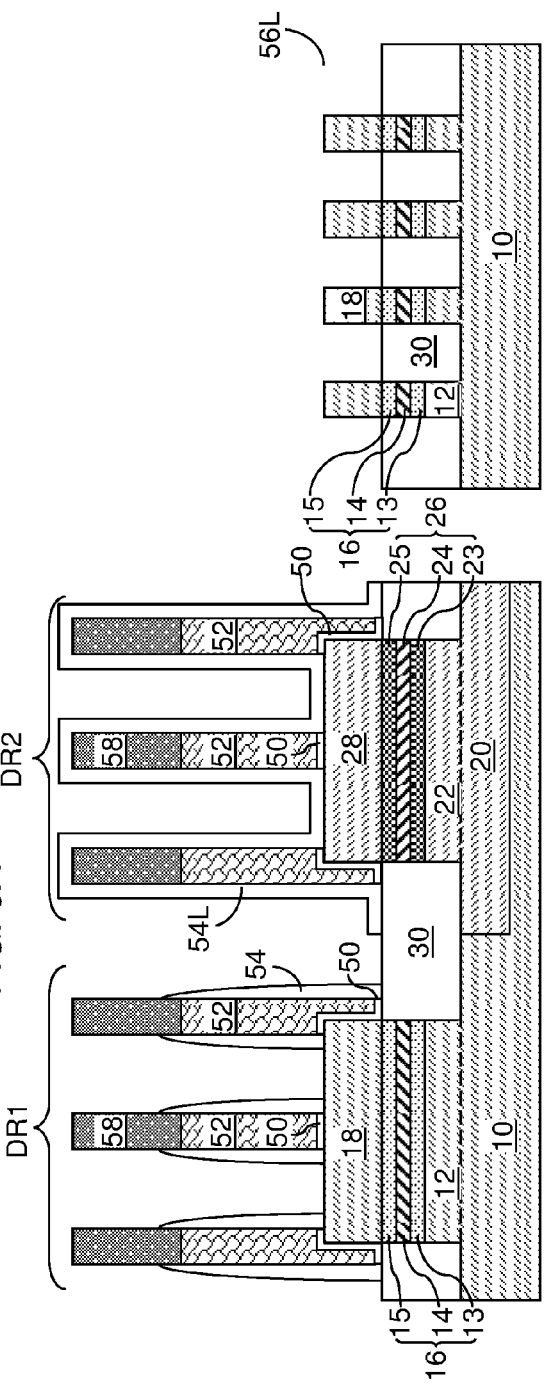

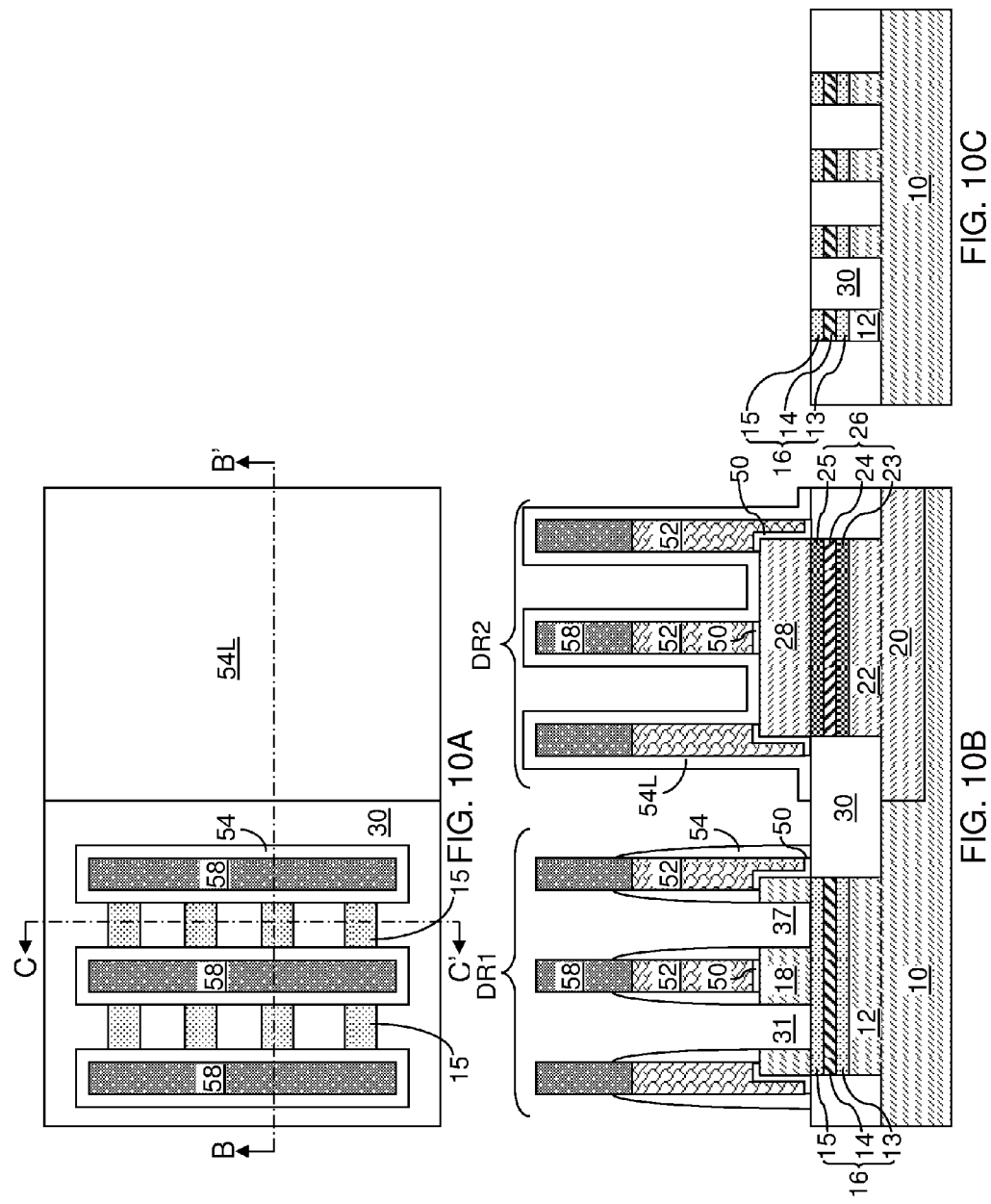

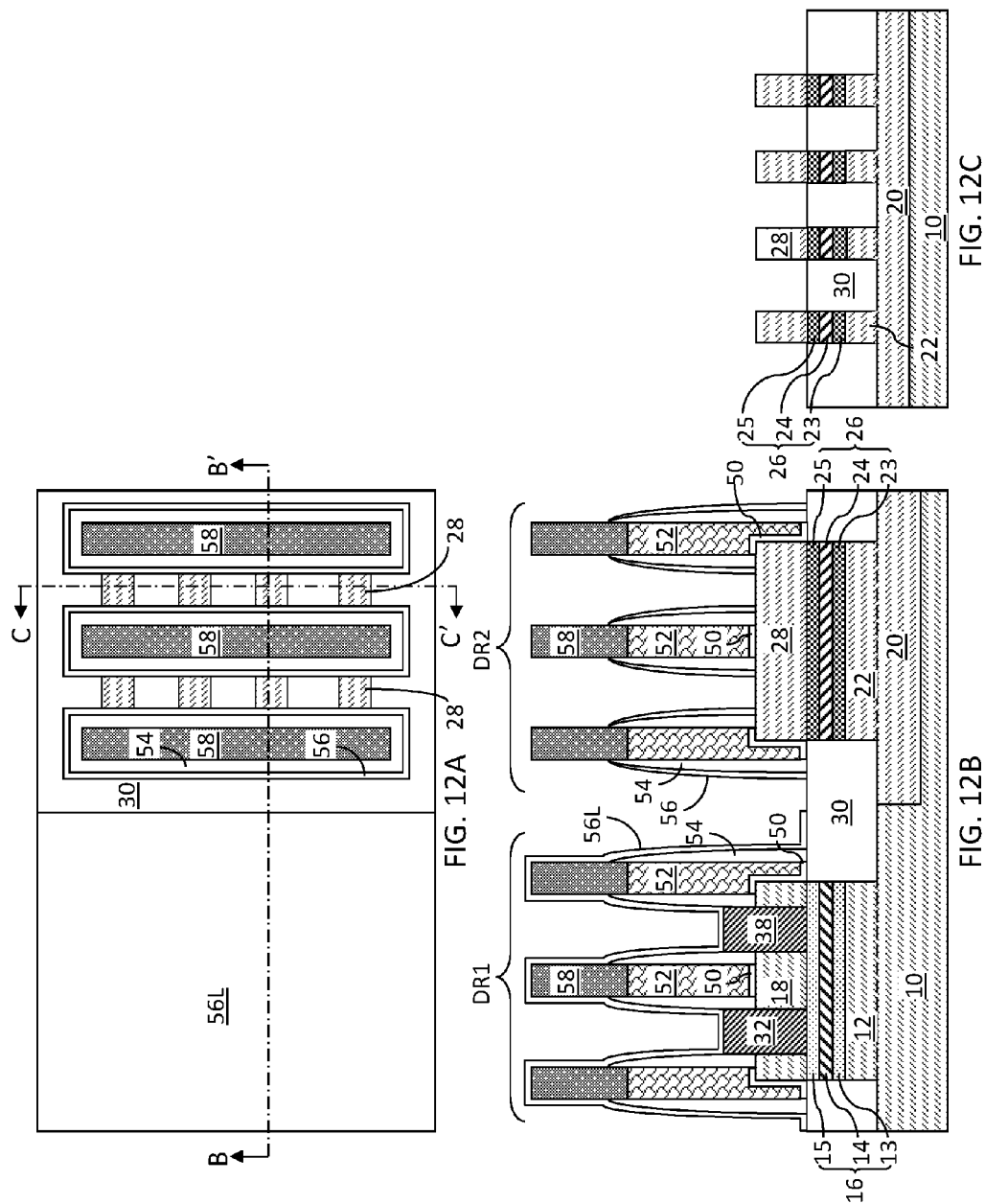

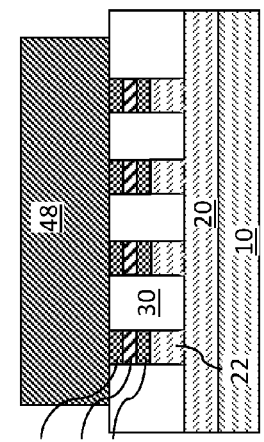
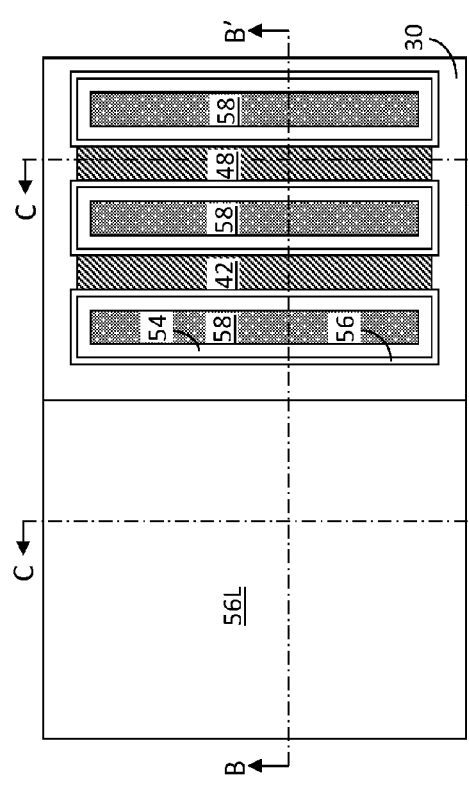
FIG. 13A
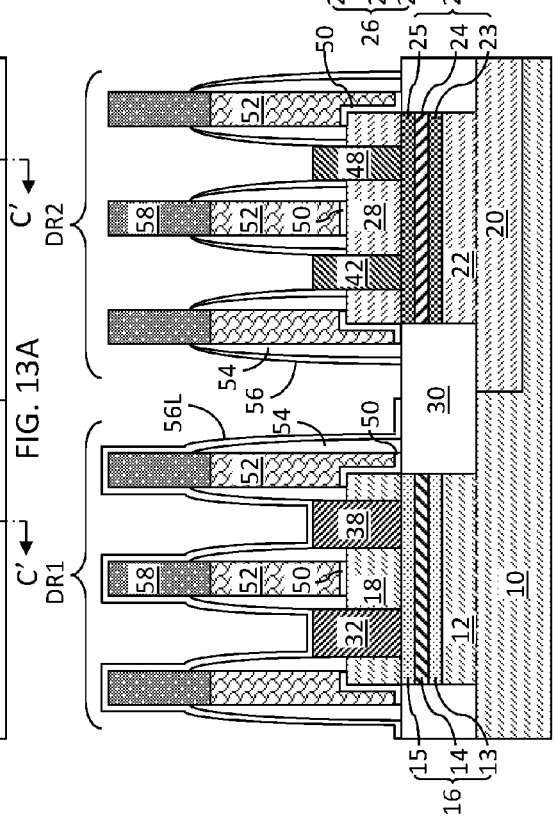
FIG. 13B
FIG. 13C

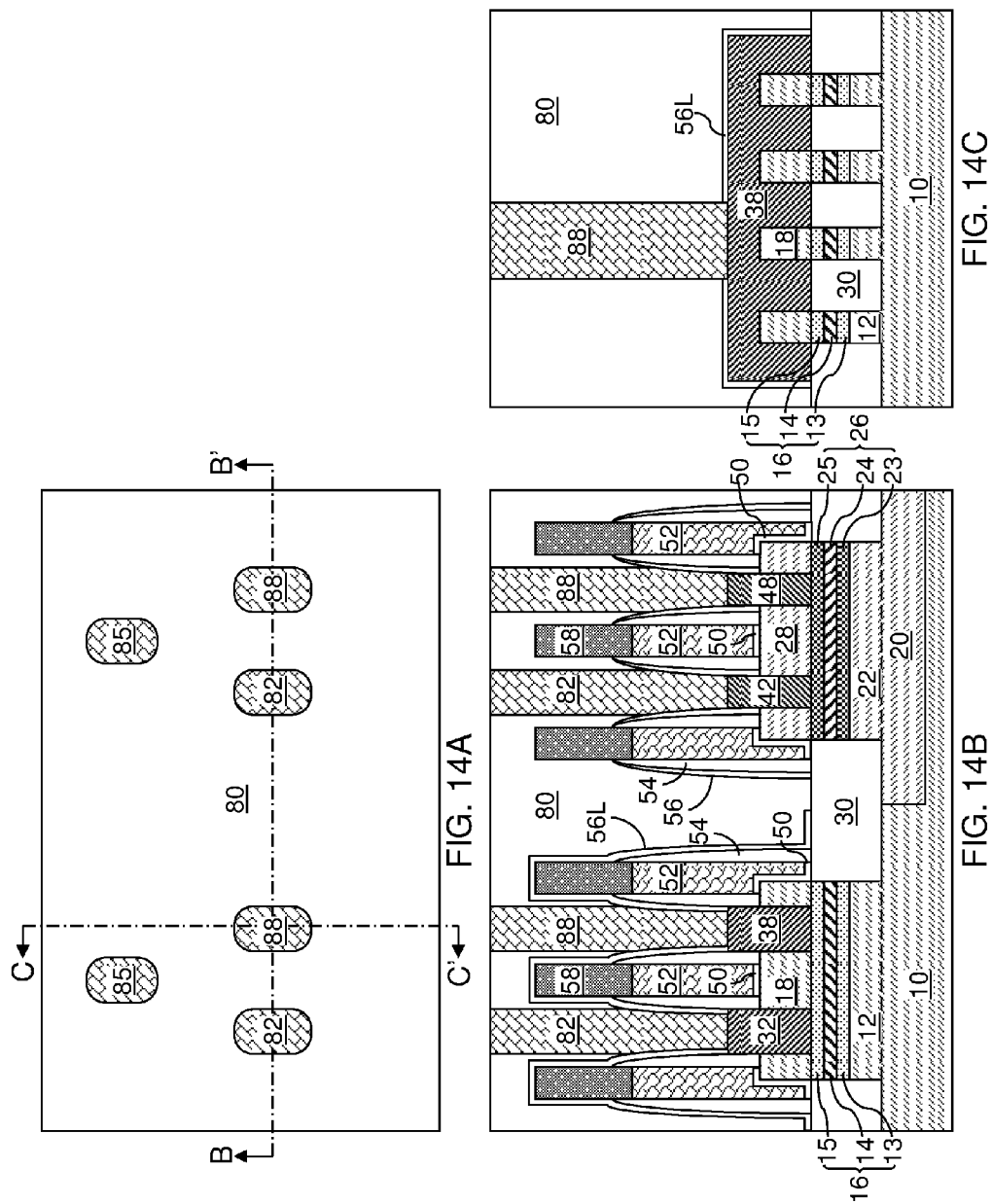

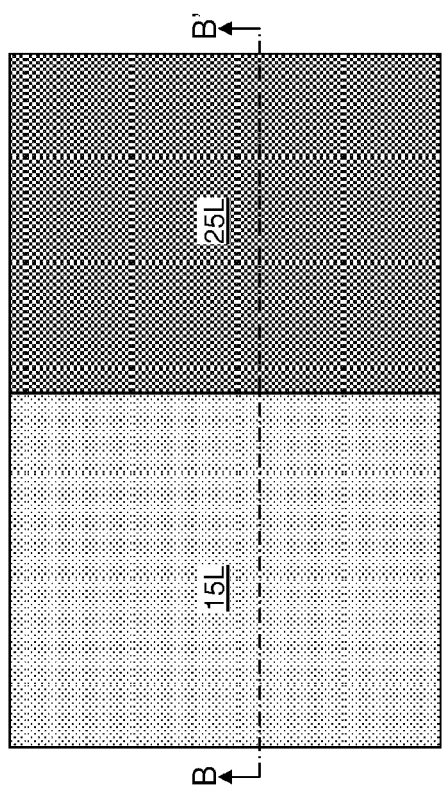
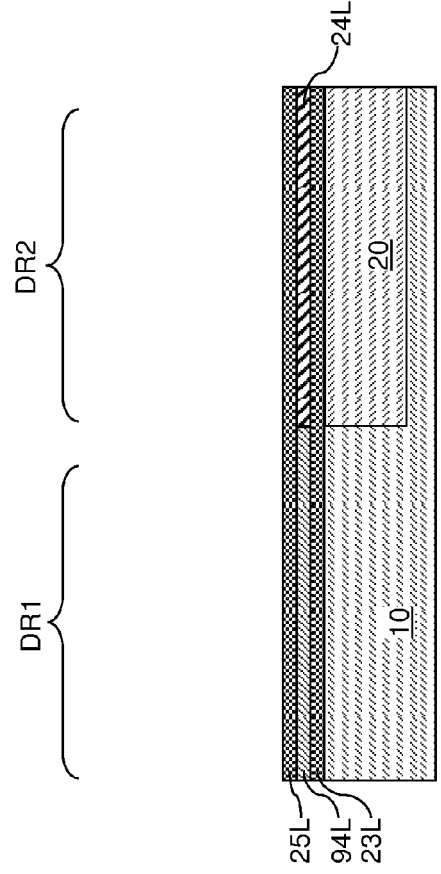
FIG. 15A
FIG. 15B

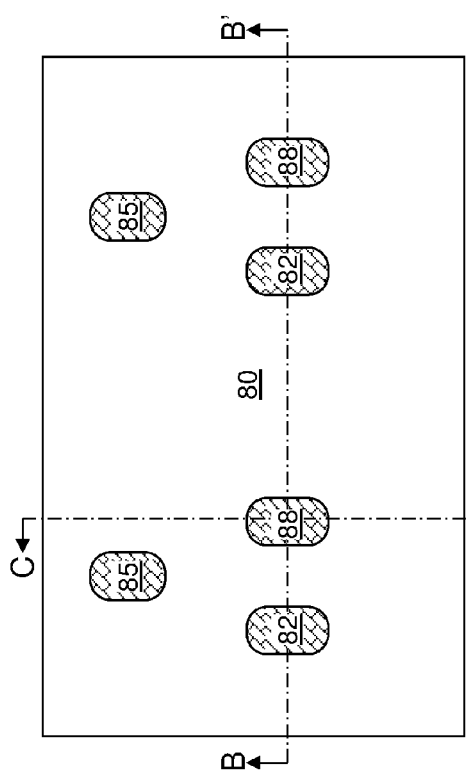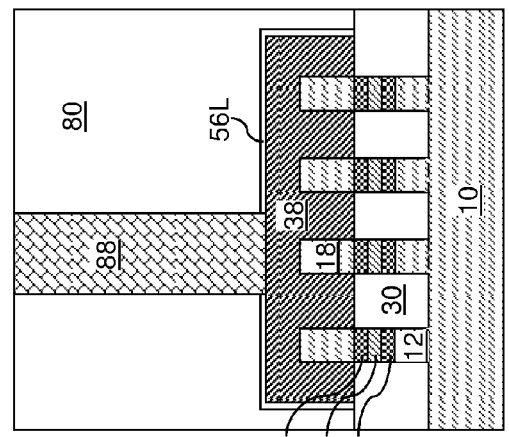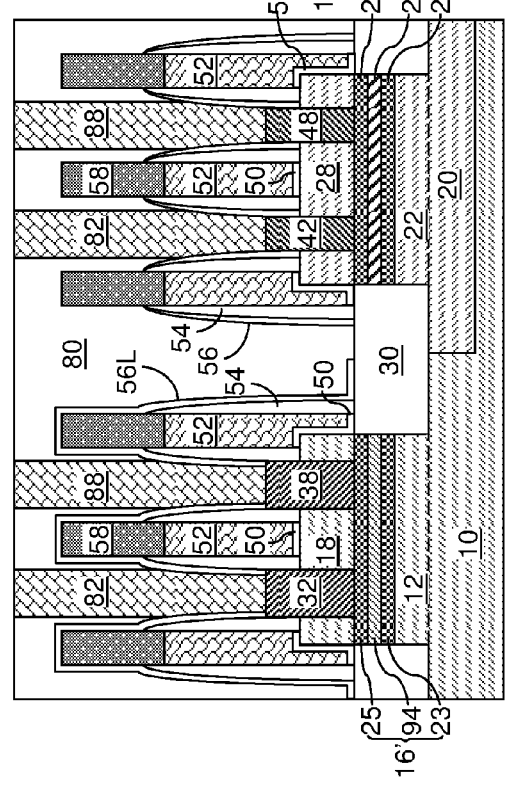

SEMICONDUCTOR FIN ISOLATION BY A WELL TRAPPING FIN PORTION

BACKGROUND

The present disclosure relates to a semiconductor structure, and particularly to semiconductor fins electrically isolated from an underlying semiconductor layer by a well trapping fin portion and a method of manufacturing the same.

Semiconductor devices formed on a semiconductor fin on a bulk semiconductor substrate typically suffer from leakage currents between the semiconductor fin and an underlying semiconductor material of the bulk semiconductor substrate. For example, the source region and the drain region of a fin field effect transistor can have leakage paths to the underlying semiconductor material.

While use of a semiconductor-on-insulator (SOI) substrate can provide electrical isolation of semiconductor fins from the substrate, SOI substrates are not generally compatible with use of stress-generating embedded semiconductor materials that can enhance the strain in the channel of a field effect transistor. Inserting a dielectric material underneath a semiconductor fin requires additional processing steps and increases the total processing time.

BRIEF SUMMARY

A bulk semiconductor substrate including a first semiconductor material is provided. A well trapping layer including a second semiconductor material and a dopant is formed on a top surface of the bulk semiconductor substrate. The combination of the second semiconductor material and the dopant within the well trapping layer is selected such that diffusion of the dopant is limited within the well trapping layer. A device semiconductor material layer including a third semiconductor material can be epitaxially grown on the top surface of the well trapping layer. The device semiconductor material layer, the well trapping layer, and an upper portion of the bulk semiconductor substrate are patterned to form at least one semiconductor fin. Semiconductor devices formed in each semiconductor fin can be electrically isolated from the bulk semiconductor substrate by the remaining portions of the well trapping layer.

According to an aspect of the present disclosure, a method of forming a semiconductor structure is provided. A well trapping layer is formed on a semiconductor substrate that includes a first semiconductor material. The well trapping layer includes a doped semiconductor material layer therein. The doped semiconductor material layer includes a second semiconductor material different from the first semiconductor material and a dopant of a first conductivity type. A third semiconductor material layer including a third semiconductor material is formed on the well trapping layer. The dopant of the first conductivity type has a lesser diffusivity in the second semiconductor material than in the first semiconductor material or in the third semiconductor material. The third semiconductor material layer, the well trapping layer, and an upper portion of the semiconductor substrate are patterned to form a fin stack structure having a pair of substantially vertical parallel sidewalls on an unpatterned portion of the semiconductor substrate.

According to another aspect of the present disclosure, a semiconductor structure is provided. The semiconductor structure includes a semiconductor substrate, a fin stack structure, and a semiconductor material portion. The semiconductor substrate includes a first semiconductor material. The fin stack structure is located on the semiconductor substrate and has a pair of substantially vertical parallel sidewalls. The fin stack structure contains a first semiconductor material fin portion, a well trapping fin portion, and at least one third semiconductor material fin portion. The first semiconductor material fin portion includes the first semiconductor material and is located over the semiconductor substrate. The well trapping fin portion is located over said first semiconductor material fin portion and contains a doped semiconductor material region that includes a second semiconductor material different from said first semiconductor material and a dopant of a first conductivity type. The at least one third semiconductor material fin portion includes a third semiconductor material and is located over the well trapping fin portion. The semiconductor material portion is located over the well trapping region and has a doping of a second conductivity type that is the opposite of the first conductivity type.

BRIEF DESCRIPTION OF SEVERAL VIEWS OF THE DRAWINGS

FIG. 2A is a top-down view of the first exemplary semiconductor structure after formation of a silicon-carbon alloy layer and a silicon-germanium alloy layer according to the first embodiment of the present disclosure.

FIG. 2B is a vertical cross-sectional view of the first exemplary semiconductor structure along the vertical plane B-B' of FIG. 2A.

FIG. 5A is a top-down view of the first exemplary semiconductor structure after formation of fin stack structures according to the first embodiment of the present disclosure.

FIG. 5B is a vertical cross-sectional view of the first exemplary semiconductor structure along the vertical plane B-B' of FIG. 5A.

FIG. 5C is a vertical cross-sectional view of the first exemplary semiconductor structure along the vertical plane C-C' of FIG. 5A.

FIG. 6A is a top-down view of the first exemplary semiconductor structure after formation of a shallow trench isolation structure according to the first embodiment of the present disclosure.

FIG. 6B is a vertical cross-sectional view of the first exemplary semiconductor structure along the vertical plane B-B' of FIG. 6A.

FIG. 6C is a vertical cross-sectional view of the first exemplary semiconductor structure along the vertical plane C-C' of FIG. 6A.

FIG. 7A is a top-down view of the first exemplary semiconductor structure after recessing the shallow trench isolation structure according to the first embodiment of the present disclosure.

FIG. 7B is a vertical cross-sectional view of the first exemplary semiconductor structure along the vertical plane B-B' of FIG. 7A.

FIG. 7C is a vertical cross-sectional view of the first exemplary semiconductor structure along the vertical plane C-C' of FIG. 7A.

FIG. 8A is a top-down view of the first exemplary semiconductor structure after formation of gate stack structures according to the first embodiment of the present disclosure.

FIG. 8B is a vertical cross-sectional view of the first exemplary semiconductor structure along the vertical plane B-B' of FIG. 8A.

FIG. 8C is a vertical cross-sectional view of the first exemplary semiconductor structure along the vertical plane C-C' of FIG. 8A.

FIG. 9A is a top-down view of the first exemplary semiconductor structure after formation of a first dielectric masking layer and first gate spacers according to the first embodiment of the present disclosure.

FIG. 9B is a vertical cross-sectional view of the first exemplary semiconductor structure along the vertical plane B-B' of FIG. 9A.

FIG. 9C is a vertical cross-sectional view of the first exemplary semiconductor structure along the vertical plane C-C' of FIG. 9A.

FIG. 10A is a top-down view of the first exemplary semiconductor structure after removing physically exposed portions of first-type third semiconductor material fin portions according to the first embodiment of the present disclosure.

FIG. 10B is a vertical cross-sectional view of the first exemplary semiconductor structure along the vertical plane B-B' of FIG. 10A.

FIG. 10C is a vertical cross-sectional view of the first exemplary semiconductor structure along the vertical plane C-C' of FIG. 10A.

FIG. 12A is a top-down view of the first exemplary semiconductor structure after formation of a second dielectric masking layer and second gate spacers according to the first embodiment of the present disclosure.

FIG. 12B is a vertical cross-sectional view of the first exemplary semiconductor structure along the vertical plane B-B' of FIG. 12A.

FIG. 12C is a vertical cross-sectional view of the first exemplary semiconductor structure along the vertical plane C-C' of FIG. 12A.

FIG. 13A is a top-down view of the first exemplary semiconductor structure after formation of a second embedded source region and a second embedded drain region according to the first embodiment of the present disclosure.

FIG. 13B is a vertical cross-sectional view of the first exemplary semiconductor structure along the vertical plane B-B' of FIG. 13A.

FIG. 13C is a vertical cross-sectional view of the first exemplary semiconductor structure along the vertical plane C-C' of FIG. 13A.

FIG. 14A is a top-down view of the first exemplary semiconductor structure after formation of a contact-level dielectric layer and contact via structures according to the first embodiment of the present disclosure.

FIG. 14B is a vertical cross-sectional view of the first exemplary semiconductor structure along the vertical plane B-B' of FIG. 14A.

FIG. 14C is a vertical cross-sectional view of the first exemplary semiconductor structure along the vertical plane C-C' of FIG. 14A.

FIG. 15A is a top-down view of a second exemplary semiconductor structure after formation of a silicon-germanium alloy layer and implantation of p-type dopants and n-type dopants according to a second embodiment of the present disclosure.

FIG. 15B is a vertical cross-sectional view of the second exemplary semiconductor structure along the vertical plane B-B' of FIG. 15A.

FIG. 16A is a top-down view of the second exemplary semiconductor structure after formation of a contact-level dielectric layer and contact via structures according to the second embodiment of the present disclosure.

FIG. 16B is a vertical cross-sectional view of the second exemplary semiconductor structure along the vertical plane B-B' of FIG. 16A.

FIG. 16C is a vertical cross-sectional view of the second exemplary semiconductor structure along the vertical plane C-C' of FIG. 16A.

DETAILED DESCRIPTION

Figure 1A:
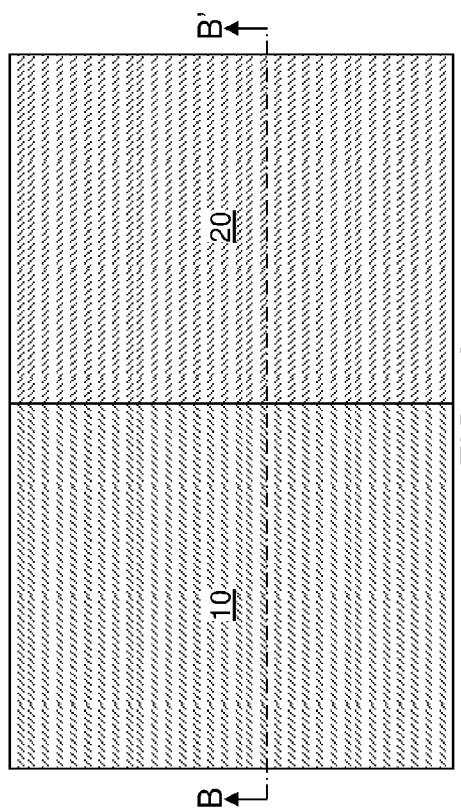
FIG. 1A is a top-down view of a first exemplary semiconductor structure after formation of a doped well according to a first embodiment of the present disclosure.

As stated above, the present disclosure relates to semiconductor fins electrically isolated from an underlying semiconductor layer by a well trapping fin portion and a method of manufacturing the same. Aspects of the present disclosure are now described in detail with accompanying figures. It is noted that like reference numerals refer to like elements across different embodiments. The drawings are not necessarily drawn to scale. Ordinals are used merely to distinguish among similar elements, and different ordinals may be employed across the specification and the claims of the instant application.

Figure 1B:
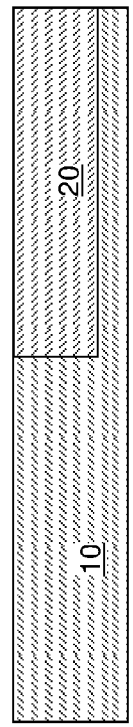
FIG. 1B is a vertical cross-sectional view of the first exemplary semiconductor structure along the vertical plane B-B' of FIG. 1A.

Referring to FIGS. 1A and 1B, a first exemplary semiconductor structure according to a first embodiment of the present disclosure includes a bulk semiconductor substrate including a first semiconductor material throughout. The first semiconductor material can be, for example, single crystalline silicon, a single crystalline silicon-germanium alloy, or a single crystalline silicon-carbon alloy. The bulk semiconductor substrate includes a first semiconductor material layer 10, which can have a p-type doping or an n-type doping. In one embodiment, a doped well 20 can be formed in an upper portion of the bulk semiconductor substrate such that the doped well has a doping of the opposite conductivity type relative to the doping of the first semiconductor material layer. For example, if the first semiconductor material layer 10 has a p-type doping, the doped well 20 has an n-type doping, and vice versa. The doped well 20 is a first semiconductor material portion, i.e., a portion including the first semiconductor material.

In one embodiment, the first semiconductor material can consist of silicon and a p-type dopant or can consist of silicon and an n-type dopant. In one embodiment, the first semiconductor material does not include germanium or carbon. In one embodiment, the entirety of the first semiconductor material layer 10 and the doped well 20 can be single crystalline with epitaxial alignment throughout.

In an illustrative example, the first exemplary semiconductor structure includes a first device region DR1 and a second device region DR2. In one embodiment, a top surface of the first semiconductor material layer 10 in the entirety of the first device region DR1, and the doped well 20 can be provided in the second device region DR2. In one embodiment, a top surface of a p-doped semiconductor region can be provided in the first device region DR1, and a top surface of an n-doped semiconductor region can be provided in the second device region DR2. In one embodiment, the first semiconductor material layer 10 can include p-doped single crystalline silicon and a top surface of the first semiconductor material layer 10 can be physically exposed in the first device region DR1, and the doped well 20 can include n-doped single crystalline silicon and a top surface of the doped well can be physically exposed in the second device region DR2. In another embodiment, the doped well 20 can be provided in the first device region DR1 and can include p-doped single crystalline silicon of which a top surface is physically exposed, and the first semiconductor material layer 10 can include an n-doped single crystalline silicon and have a physically exposed top surface within the second device region DR2.

Referring to FIGS. 2A and 2B, a silicon-carbon alloy layer 16L is formed on a p-doped semiconductor region, and a silicon-germanium alloy layer 26L is formed on an n-doped semiconductor region. Specifically, the silicon-carbon alloy layer 16L is selected on the top surface of the p-doped semiconductor region selected from the first semiconductor material layer 10 and the doped well 20, and the silicon-germanium alloy layer 26L is formed on the top surface of the n-doped semiconductor region selected from the first semiconductor material layer 10 and the doped well 20.

The silicon-carbon alloy layer 16L and the silicon-germanium alloy layer 26L can be formed sequentially. The silicon-carbon alloy layer 16L may be formed prior to, or after, formation of the silicon-germanium alloy layer 26L. In order to form the silicon-carbon alloy layer 16L, the top surface of the n-doped semiconductor region (i.e., one of the first semiconductor material layer 10 and the doped well 20) is masked with a dielectric masking material layer (such as a silicon oxide layer or a silicon nitride layer), while deposition of a silicon-carbon alloy material occurs on the top surface of the p-doped semiconductor region. Selective epitaxy can be employed to deposit the silicon-carbon alloy on the p-doped semiconductor region, while the silicon-carbon alloy material does not grow on dielectric surfaces. In one embodiment, the silicon-carbon alloy layer 16L can be formed as an intrinsic (undoped) single crystalline silicon-carbon alloy layer. The dielectric masking layer is subsequently removed.

In order to form the silicon-germanium alloy layer 26L, the top surface of the p-doped semiconductor region (i.e., the other of the first semiconductor material layer 10 and the doped well 20) is masked with a dielectric masking material layer (such as a silicon oxide layer or a silicon nitride layer), while deposition of a silicon-germanium alloy material occurs on the top surface of the n-doped semiconductor region. Selective epitaxy can be employed to deposit the silicon-germanium alloy on the n-doped semiconductor region, while the silicon-germanium alloy material does not grow on dielectric surfaces. In one embodiment, the silicon-germanium alloy layer 26L can be formed as an intrinsic (undoped) single crystalline silicon-germanium alloy layer. The dielectric masking layer is subsequently removed.

The silicon-carbon alloy layer 16L can have an atomic concentration of carbon in a range from 0.1% to 2.0%, the atomic concentration of silicon being the balance. The silicon-germanium alloy layer 26L can have an atomic concentration of germanium in a range from 1% to 80%, the atomic concentration of silicon being the balance. The thickness of the silicon-carbon alloy layer 16L can be in a range from 10 nm to 100 nm, although lesser and greater thicknesses can also be employed. The thickness of the silicon-germanium alloy layer 26L can be in a range from 10 nm to 100 nm, although lesser and greater thicknesses can also be employed.

Within each device region, the material of the silicon-carbon alloy layer 16L or the material of the silicon-germanium alloy layer 26L is referred to as a second semiconductor material. Thus, in the first device region DR1, the first semiconductor material is p-doped, and the second semiconductor material is a silicon-carbon alloy material. In the second device region DR2, the first semiconductor material is n-doped, and the second semiconductor material is a silicon-germanium alloy material.

Figure 3A:
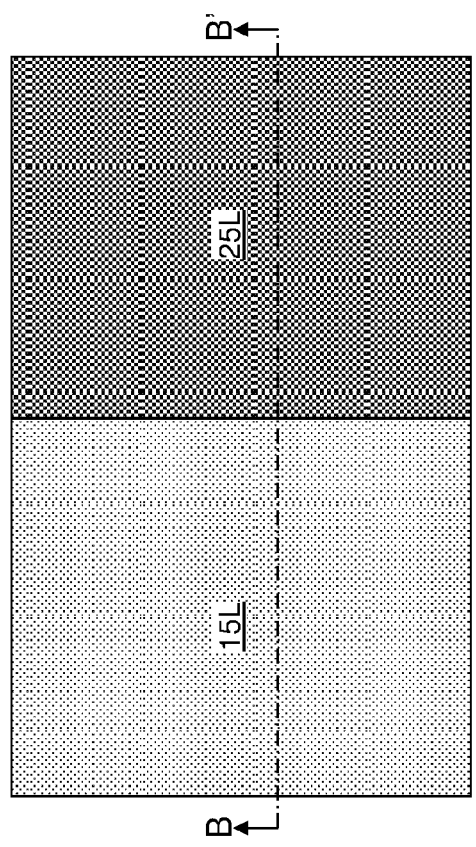
FIG. 3A is a top-down view of the first exemplary semiconductor structure after introducing n-type dopants into the silicon-carbon alloy layer and introducing p-type dopants into the silicon-germanium alloy layer according to the first embodiment of the present disclosure.
Figure 3B:
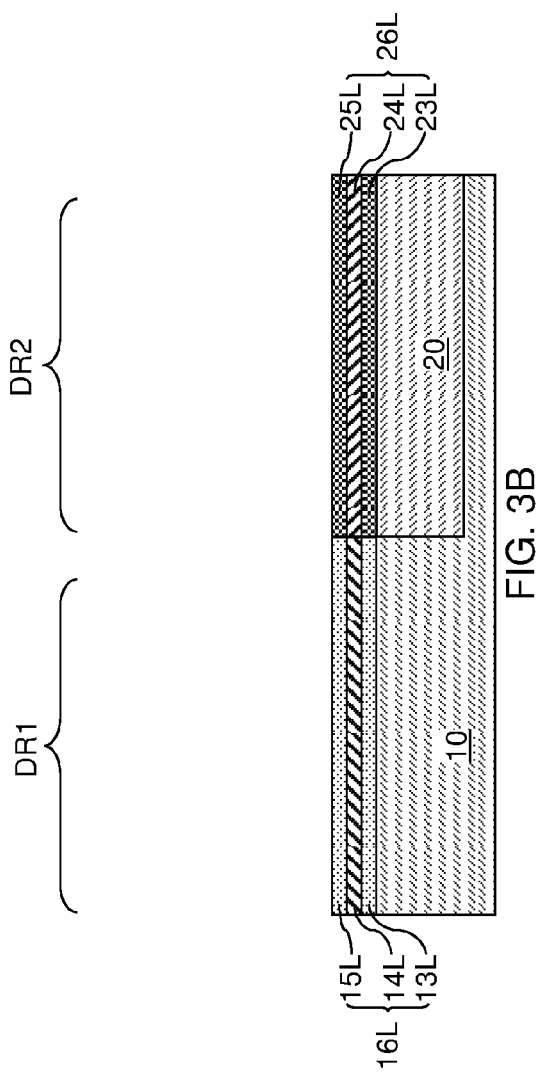
FIG. 3B is a vertical cross-sectional view of the first exemplary semiconductor structure along the vertical plane B-B' of FIG. 3A.

Referring to FIGS. 3A and 3B, n-type dopants are introduced into the silicon-carbon alloy layer 16L employing a masked ion implantation process, and p-type dopants are introduced into the silicon-germanium alloy layer 26L employing another masked ion implantation process. The species of the n-dopant is selected such that the n-type dopants implanted into the silicon-carbon alloy layer 16L have a lesser diffusivity in the silicon-carbon alloy layer 16L than in the underlying p-doped semiconductor material region, i.e., one of the first semiconductor material of the first semiconductor material layer 10 and the doped well 20 that is present in the first device region DR1. The species of the p-dopant is selected such that the p-type dopants implanted into the silicon-germanium alloy layer 26L have a lesser diffusivity in the silicon-germanium alloy layer 26L than in the underlying n-doped semiconductor material region, i.e., the other of the first semiconductor material of the first semiconductor material layer 10 and the doped well 20 that is present in the second device region DR2.

Within each device region, the conductivity type of the implanted dopants is referred to as a first conductivity type. In the first device region DR1, the first conductivity type is n-type. In the second device region DR2, the second conductivity type is p-type. Within each device region, the dopant of the first conductivity type has a lesser diffusivity in the second semiconductor material (which is the silicon-carbon alloy material in the first device region DR1 and the silicon-germanium alloy material in the second device region DR2) than in the first semiconductor material.

Within each device region, the second semiconductor material layer (which is the silicon-carbon alloy layer 16L in the first device region DR1 and the silicon-germanium alloy layer 26L in the second device region DR2) functions as a trapping well that provides electrical isolation via a p-n junction for a semiconductor material portion to be subsequently deposited thereupon. Thus, each second semiconductor material layer (16L, 26L) is herein referred to as a well trapping layer, i.e., a layer that functions as a well providing trapping of electrical charges provided by leakage current, thereby providing electrical isolation of the semiconductor material portion to be subsequently formed.

Within the first device region DR1, the well trapping layer is the silicon-carbon alloy layer 16. Within the second device region DR2, the well trapping layer is the silicon-germanium alloy layer 26. The entirety of each well trapping layer (16L or 26L) includes the second semiconductor material for the corresponding device region (DR1 or DR2).

In one embodiment, an ion implantations process can be performed in the first device region DR1 such that the n-type dopants are implanted into a middle portion of the silicon-carbon alloy layer 16L. The middle portion of the silicon-carbon alloy layer 16L in which the concentration of the implanted n-type dopants is in a range between 10% of the peak atomic concentration and 100% of the peak atomic concentration is herein referred to as an n-doped silicon-carbon alloy layer 14L, which is a doped semiconductor material region including the silicon-carbon alloy material (that is the second semiconductor material within the first device region DR1) and the n-type dopant (that is the first conductivity type dopant within the first device region DR1). In one embodiment, the n-type dopant is arsenic or phosphorus. The n-type dopant has a lesser diffusivity in the silicon-carbon alloy material than in the first semiconductor material in the first device region DR1 (which can be silicon). An upper silicon-carbon alloy layer 15L formed above the n-doped silicon-carbon alloy layer 14L has a vertical dopant concentration that exponentially decreases with a vertical distance from the interface with the n-doped silicon-carbon alloy layer 14L. A lower silicon-carbon alloy layer 13L formed below the n-doped silicon-carbon alloy layer 14L has a vertical dopant concentration that exponentially decreases with a vertical distance from the interface with the n-doped silicon-carbon alloy layer 14L. After an anneal that activates the n-type dopants, the thickness of the n-doped silicon-carbon alloy layer 14L increases, and the thicknesses of the upper and lower silicon-carbon alloy regions (15L, 13L) decrease. The thickness of the n-doped silicon-carbon alloy layer 14L can be in a range from 10% to 80% of the thickness of the silicon-carbon alloy layer 16L. The peak atomic concentration of the n-type dopants in the n-doped silicon-carbon alloy layer 14L can be in a range from $1.0 \times 10^{17}/cm^3$ to $1.0 \times 10^{20}/cm^3$, although lesser and greater peak concentrations can also be employed.

In one embodiment, another ion implantations process can be performed in the second device region DR2 such that the p-type dopants are implanted into a middle portion of the silicon-germanium alloy layer 26L. The middle portion of the silicon-germanium alloy layer 26L in which the concentration of the implanted p-type dopants is in a range between 10% of the peak atomic concentration and 100% of the peak atomic concentration is herein referred to as a p-doped silicon-germanium alloy layer 24L, which is a doped semiconductor material region including the silicon-germanium alloy material (that is the second semiconductor material within the second device region DR2) and the p-type dopant (that is the first conductivity type dopant within the second device region DR2). In one embodiment, the p-type dopant is boron. The p-type dopant has a lesser diffusivity in the silicon-germanium alloy material than in the first semiconductor material in the second device region DR2 (which can be silicon). An upper silicon-germanium alloy layer 25L formed above the p-doped silicon-germanium alloy layer 24L has a vertical dopant concentration that exponentially decreases with a vertical distance from the interface with the p-doped silicon-germanium alloy layer 24L. A lower silicon-germanium alloy layer 23L formed below the p-doped silicon-germanium alloy layer 24L has a vertical dopant concentration that exponentially decreases with a vertical distance from the interface with the p-doped silicon-germanium alloy layer 24L. After an anneal that activates the p-type dopants, the thickness of the p-doped silicon-germanium alloy layer 24L increases, and the thicknesses of the upper and lower silicon-germanium alloy layers (25L, 23L) decrease. The thickness of the p-doped silicon-germanium alloy layer 24L can be in a range from 10% to 80% of the thickness of the silicon-germanium alloy layer 26L. The peak atomic concentration of the p-type dopants in the p-doped silicon-germanium alloy layer 24L can be in a range from $1.0 \times 10^{17}/cm^3$ to $1.0 \times 10^{20}/cm^3$, although lesser and greater peak concentrations can also be employed.

Figure 4A:
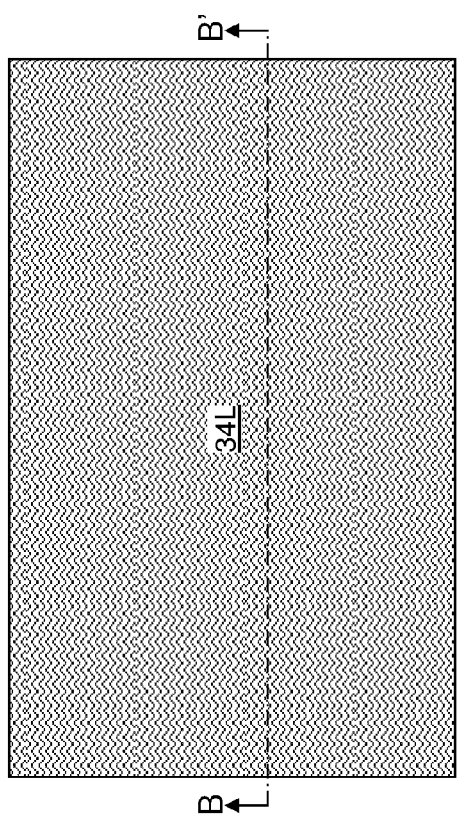
FIG. 4A is a top-down view of the first exemplary semiconductor structure after formation of a device semiconductor material layer, a first dielectric cap layer, and a second dielectric cap layer according to the first embodiment of the present disclosure.
Figure 4B:
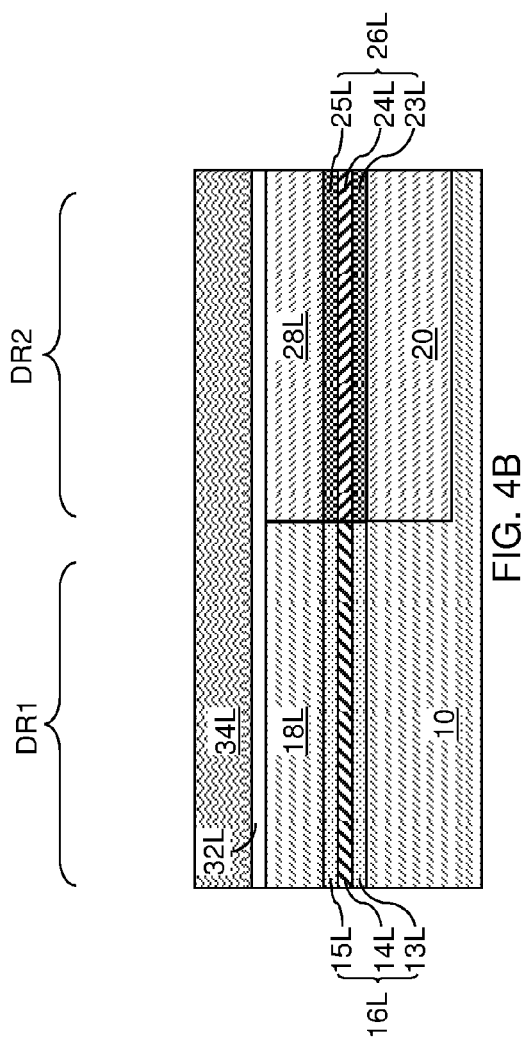
FIG. 4B is a vertical cross-sectional view of the first exemplary semiconductor structure along the vertical plane B-B' of FIG. 4A.

Referring to FIGS. 4A and 4B, a semiconductor material layer is formed in each of the first device region DR1 and the second device region DR2. Within each device region, the material of the semiconductor material layer is herein referred to as a third semiconductor material. Specifically, a first-type third semiconductor material layer 18L is formed in the first device region DR1, and a second-type third semiconductor material layer 28L is formed in the second device region DR2. The thickness of each of the first-type third semiconductor material layer 18L and the second-type third semiconductor material layer 28L can be in a range from 30 nm to 300 nm, although lesser and greater thicknesses can also be employed. The first-type third semiconductor material layer 18L can be intrinsic, or can have an n-type doping at a dopant concentration in a range from $1.0 \times 10^{14}/cm^3$ to $1.0 \times 10^{18}/cm^3$, although lesser and greater peak concentrations can also be employed. The second-type third semiconductor material layer 28L can be intrinsic, or can have a p-type doping at a dopant concentration in a range from $1.0 \times 10^{14}/cm^3$ to $1.0 \times 10^{18}/cm^3$, although lesser and greater peak concentrations can also be employed.

The third semiconductor material of each device region can be formed, for example, by epitaxial deposition of the third semiconductor material. The third semiconductor material for the first device region DR1 is selected such that the n-type dopants in the silicon-carbon alloy layer 16L have a lesser diffusivity in the silicon-carbon alloy of the silicon-carbon alloy layer 16L (which is the second semiconductor material of the first device region DR1) than in the first semiconductor material or in the third semiconductor material of the first device region DR1. The third semiconductor material for the second device region DR2 is selected such that the p-type dopants in the silicon-germanium alloy layer 26L have a lesser diffusivity in the silicon-germanium alloy of the silicon-germanium alloy layer 26L (which is the second semiconductor material of the second device region DR1) than in the first semiconductor material or in the third semiconductor material of the second device region DR2.

In one embodiment, the third semiconductor material can be the same across the first and second device regions (DR1, DR2). In this case, a single semiconductor material layer can be epitaxially grown simultaneously on the silicon-carbon alloy layer 16L and the silicon-germanium alloy layer 26L. In this case, the single semiconductor material layer includes the first-type third semiconductor material layer 18L and the second-type third semiconductor material layer 28L. The first-type third semiconductor material layer 18L and the second-type third semiconductor material layer 28L may be intrinsic, or can be doped with p-type dopants and n-type dopants, respectively. The first-type third semiconductor material layer 18L and the second-type third semiconductor material layer 28L are semiconductor layers in which components of semiconductor devices can be subsequently formed, and as such, are referred to as device semiconductor material layers.

Within each device region, the dopant of the first conductivity type has a lesser diffusivity in the second semiconductor material (which is the silicon-carbon alloy material in the first device region DR1 and the silicon-germanium alloy material in the second device region DR2) than in the first semiconductor material, and than in the third semiconductor material (which is the material of the first-type third semiconductor material layer 18L in the first device region DR1, or the material of the second-type third semiconductor material layer 28L in the second device region DR2).

At least one dielectric cap layer can be subsequently formed. In one embodiment, the at least one dielectric cap layer can include a stack of a first dielectric cap layer 32L and a second dielectric cap layer 34L can be subsequently formed. In one embodiment, the first dielectric cap layer 32L can include silicon oxide having a thickness in a range from 1 nm to 10 nm, and the second dielectric cap layer 34L can include silicon nitride having a thickness in a range from 3 nm to 60 nm, although lesser and greater thicknesses can also be employed.

Referring to FIGS. 5A-5C, a photoresist material (not shown) is applied over the at least one dielectric cap layer (32L, 34L), and is lithographically patterned to form patterned photoresist portions (not shown) having horizontal cross-sectional areas of rectangles. The pattern of the patterned photoresist portions is transferred through the at least one dielectric cap layer (32L, 34L) by an anisotropic etch. Each dielectric cap stack (32, 34) includes a first dielectric cap portion 32 and a second dielectric cap portion 34. The patterned photoresist portions can be optionally removed after patterning of the at least one dielectric cap layer (32L, 34L) into dielectric cap stacks (32, 34).

Upon formation of the dielectric cap stacks (32, 34), an anisotropic etch is employed to transfer the pattern in the dielectric cap stacks (32, 34) into the underlying semiconductor layers. In each device region, the underlying semiconductor layers include a third semiconductor material layer, a well trapping layer, and an upper portion of the semiconductor substrate (10, 20). Fin stack structures are formed in each device region. Any patterned photoresist portions, if present, can be removed during the anisotropic etch that forms the fin stack structures.

Specifically, in the first device region DR1, the underlying semiconductor layers include the first-type third semiconductor material layer 18L, the silicon-carbon alloy layer 16L, and the upper portion of one of the first semiconductor material layer 10 and the doped well 20. Each remaining portion of the first-type third semiconductor material layer 18L is a semiconductor fin portion including the third semiconductor material of the first device region DR1, and is herein referred to as a first-type third semiconductor fin portion 18. As used herein, a "fin portion" refers to a portion having a pair of parallel sidewalls extending along a horizontal direction. Each remaining portion of the silicon-carbon alloy layer 16L includes a first-type well trapping fin portion 16, which is a fin portion that includes a trapping well and is located within the first device region DR1. Each first-type well trapping fin portion 16 includes an n-doped silicon-carbon alloy fin portion 14, an upper silicon-carbon alloy fin portion 15, and a lower silicon-carbon alloy fin portion 13. Each n-doped silicon-carbon alloy fin portion 14 is a remaining portion of the n-doped silicon-carbon alloy layer 14L. Each upper silicon-carbon alloy fin portion 15 is a remaining portion of the upper silicon-carbon alloy layer 15L. Each lower silicon-carbon alloy fin portion 13 is a remaining portion of the lower silicon-carbon alloy layer 13L. Each patterned upper portion of the first semiconductor material region within the first device region is herein referred to as a first-type first semiconductor material fin portion 12. The first-type first semiconductor material fin portion 12 can be a patterned portion of an upper portion of the first semiconductor material layer 10 as provided at the processing steps of FIGS. 1A and 1B, or can be a patterned portion of the upper portion of the doped well 20 as provided at the processing steps of FIGS. 1A and 1B.

In the second device region DR2, the underlying semiconductor layers include the second-type third semiconductor material layer 28L, the silicon-germanium alloy layer 26L, and the upper portion of the other of the first semiconductor material layer 10 and the doped well 20. Each remaining portion of the second-type third semiconductor material layer 28L is a semiconductor fin portion including the third semiconductor material of the second device region DR1, and is herein referred to as a second-type third semiconductor fin portion 28. Each remaining portion of the silicon-germanium alloy layer 26L includes a second-type well trapping fin portion 26, which is a fin portion that includes a trapping well and is located within the second device region DR2. Each second-type well trapping fin portion 26 includes a p-doped silicon-germanium alloy fin portion 24, an upper silicon-germanium alloy fin portion 25, and a lower silicon-germanium alloy fin portion 23. Each n-doped silicon-germanium alloy fin portion 24 is a remaining portion of the n-doped silicon-germanium alloy layer 24L. Each upper silicon-germanium alloy fin portion 25 is a remaining portion of the upper silicon-germanium alloy layer 25L. Each lower silicon-germanium alloy fin portion 23 is a remaining portion of the lower silicon-germanium alloy layer 23L. Each patterned upper portion of the first semiconductor material region within the second device region is herein referred to as a second-type first semiconductor material fin portion 22. The first-type first semiconductor material fin portion 22 can be a patterned portion of a patterned portion of the upper portion of the doped well 20 as provided at the processing steps of FIGS. 2A and 2B, or can be an upper portion of the first semiconductor material layer 20 as provided at the processing steps of FIGS. 2A and 2B.

The fin stack structures in the first device region DR1 are herein referred to as first-type fin stack structures. The fin stack structures in the second device region DR2 are herein referred to as second-type fin stack structures. Each fin stack structure has a pair of substantially vertical parallel sidewalls, and is located on an unpatterned portion of the semiconductor substrate (10, 20). The horizontal cross-sectional shape of each fin stack structure can be substantially the same irrespective of the height of the cross-section. As used herein, two shapes are substantially the same if the difference between two shapes is less than twice the surface roughness at the atomic level.

Each fin stack structure includes a first semiconductor material fin portion, a well trapping fin portion, and a third semiconductor material fin portion. The first semiconductor material fin portion includes the first semiconductor material and is located over the semiconductor substrate (10, 20). The well trapping fin portion includes the second semiconductor material of the corresponding device region, is located over the first semiconductor material fin portion, and contains a doped semiconductor material region that includes the second semiconductor material and a dopant of the first conductivity type for the corresponding device region. The doped semiconductor material region laterally extends throughout the area of the fin stack structure. The third semiconductor material fin portion includes the third semiconductor material for the corresponding region, and is located over the well trapping fin portion.

Specifically, each first-type fin stack structure (12, 16, 18) includes a first-type first semiconductor material fin portion 12, a first-type well trapping fin portion 16, and a first-type third semiconductor material fin portion 18. The first-type first semiconductor material fin portion 12 includes the first semiconductor material and is located over the semiconductor substrate (10, 20). The first-type well trapping fin portion 16 includes the second semiconductor material of the first device region DR1, is located over the first-type first semiconductor material fin portion 12, and contains an n-doped silicon-carbon alloy fin portion 14. The n-doped silicon-carbon alloy fin portion 14 is a doped semiconductor material region that includes the second semiconductor material and an n-type dopant, which is the dopant of the first conductivity type for the first device region DR1. The n-doped silicon-carbon alloy fin portion 14 laterally extends throughout the area of the first-type fin stack structure (12, 16, 18). The first-type third semiconductor material fin portion 18 includes the third semiconductor material for the first device region DR1, and is located over the first-type well trapping fin portion 16. Within each first-type fin stack structure (12, 16, 18), the sidewalls of the first-type first semiconductor material fin portion 12, the first-type well trapping fin portion 16, and the first-type third semiconductor material fin portion 18 are vertically coincident among one another. As used herein, two surfaces are vertically coincident if there exists a vertical surface from which each of the two surfaces deviates by no more than the surface roughness of the respective surface.

Each second-type fin stack structure (22, 26, 28) includes a second-type first semiconductor material fin portion 22, a second-type well trapping fin portion 26, and a second-type third semiconductor material fin portion 28. The second-type first semiconductor material fin portion 22 includes the first semiconductor material and is located over the semiconductor substrate (10, 20). The second-type well trapping fin portion 26 includes the second semiconductor material of the second device region DR2, is located over the second-type first semiconductor material fin portion 22, and contains a p-doped silicon-germanium alloy fin portion 24. The p-doped silicon-germanium alloy fin portion 24 is a doped semiconductor material region that includes the second semiconductor material and a p-type dopant, which is the dopant of the first conductivity type for the second device region DR2. The p-doped silicon-germanium alloy fin portion 24 laterally extends throughout the area of the second-type fin stack structure (22, 26, 28). The second-type third semiconductor material fin portion 28 includes the third semiconductor material for the second device region DR2, and is located over the second-type well trapping fin portion 26. Within each second-type fin stack structure (22, 26, 28), the sidewalls of the second-type first semiconductor material fin portion 22, the second-type well trapping fin portion 26, and the second-type third semiconductor material fin portion 28 are vertically coincident among one another.

Referring to FIGS. 6A-6C, a dielectric material such as silicon oxide is deposited over the dielectric cap stacks (32, 34), the first-type fin stack structures (12, 16, 18), and the second-type fin stack structures (22, 26, 28). The deposited dielectric material is subsequently planarized, for example, by chemical mechanical planarization to form a shallow trench isolation structure 30 that laterally surrounds each of the first-type fin stack structures (12, 16, 18) and the second-type fin stack structures (22, 26, 28). In one embodiment, the top surface of the dielectric cap stacks (32, 34) can be employed as stopping surfaces for the planarization process.

Referring to FIGS. 7A-7C, the shallow trench isolation structure 30 is recessed by an etch below the top surfaces of the first-type fin stack structures (12, 16, 18) and the second-type fin stack structures (22, 26, 28). Sidewall surfaces of the third semiconductor material fin portions (18, 28) are physically exposed. In one embodiment, the recessed top surface of the shallow trench isolation structure 30 can be substantially coplanar with the interface between the first-type well trapping fin portion 16 and the first-type third semiconductor material fin portion 18 and/or with the interface between the second-type well trapping fin portion 26 and the second-type third semiconductor material fin portion 28.

Referring to FIGS. 8A-8C, gate stack structures can be formed along the widthwise direction of each fin stack structure (12, 16, 18; 22, 26, 28). As used herein, a widthwise direction is a horizontal direction that is perpendicular to the lengthwise direction. Each gate stack structure includes a vertical stack, from bottom to top, of a gate dielectric 50, a gate electrode 52, and a gate cap dielectric 58. The gate stack structures (50, 52, 58) can be formed, for example, by formation of a gate material layer stack including a gate dielectric layer, a gate electrode layer including at least one conductive material, and a gate cap dielectric layer including a dielectric material, and by patterning the gate material layer stack by a combination of lithographic methods and at least one anisotropic etch. In one embodiment, a plurality of gate stack structures (50, 52, 58) may straddle a fin stack structure (12, 16, 18; or 22, 26, 28). One or more gate stack structures (50, 52, 58) can straddle each fin stack structure (12, 16, 18; or 22, 26, 28). In one embodiment, a gate dielectric 50 may contact the entirety of an end wall of a third semiconductor material fin portions (18 or 28).

Referring to FIGS. 9A-9C, a first dielectric masking layer 54L is deposited over the first exemplary semiconductor structure by a conformal deposition method such as low pressure chemical vapor deposition (LPCVD). The portion of the first dielectric masking layer 54L in the second device region DR2 can be masked by a patterned photoresist layer (not shown), while the portion of the first dielectric masking layer 54L is physically exposed in the first device region DR1. While the patterned photoresist layer protects the portion of the first dielectric masking layer 54L in the second device region DR2, horizontal portions of the first dielectric masking layer 54L in the first device region DR1 can be removed by an anisotropic etch that employs the patterned photoresist layer as an etch mask. The remaining vertical portions of the first dielectric masking layer 54L forms first gate spacers 54. Each first gate spacer 54 laterally surrounds a gate stack structure (50, 52, 58). The patterned photoresist layer can be removed, for example, by ashing.

A source region and a drain region can be formed on the first-type fin stack structures (12, 16, 18). Specifically, the source region and the drain region can be formed in the sub-portions of the first-type third semiconductor material fin portion 18 that are not covered by the gate stack structures (50, 52, 58) or the first gate spacers 54.

Referring to FIGS. 10A-10C, physically exposed portions of the first-type third semiconductor material fin portion 18 can be removed, for example, by an anisotropic etch in an exemplary processing sequence. Regions of the third semiconductor material from the (first-type fin stack structures 12, 16, 18) are removed employing the first gate spacers 54 and the (gate stack structure 50, 52, 58) as an etch mask. In one embodiment, the third semiconductor material of the first device region DR1 can be etched employing the top surfaces of the first-type well trapping fin portion 16 as an etch stop surfaces or as endpoint surfaces. In one embodiment, at least one source side cavity 31 and at least one drain side cavity 37 can be formed in each first-type fin stack structure (12, 16, 18). The remaining portion of each first-type third semiconductor material fin portion 18 as provided at the end of the processing steps of FIGS. 9A-9C includes a plurality of third semiconductor material fin portions 18 after the processing steps of FIGS. 10A-10C.

Figures 11A, 11B, 11C:
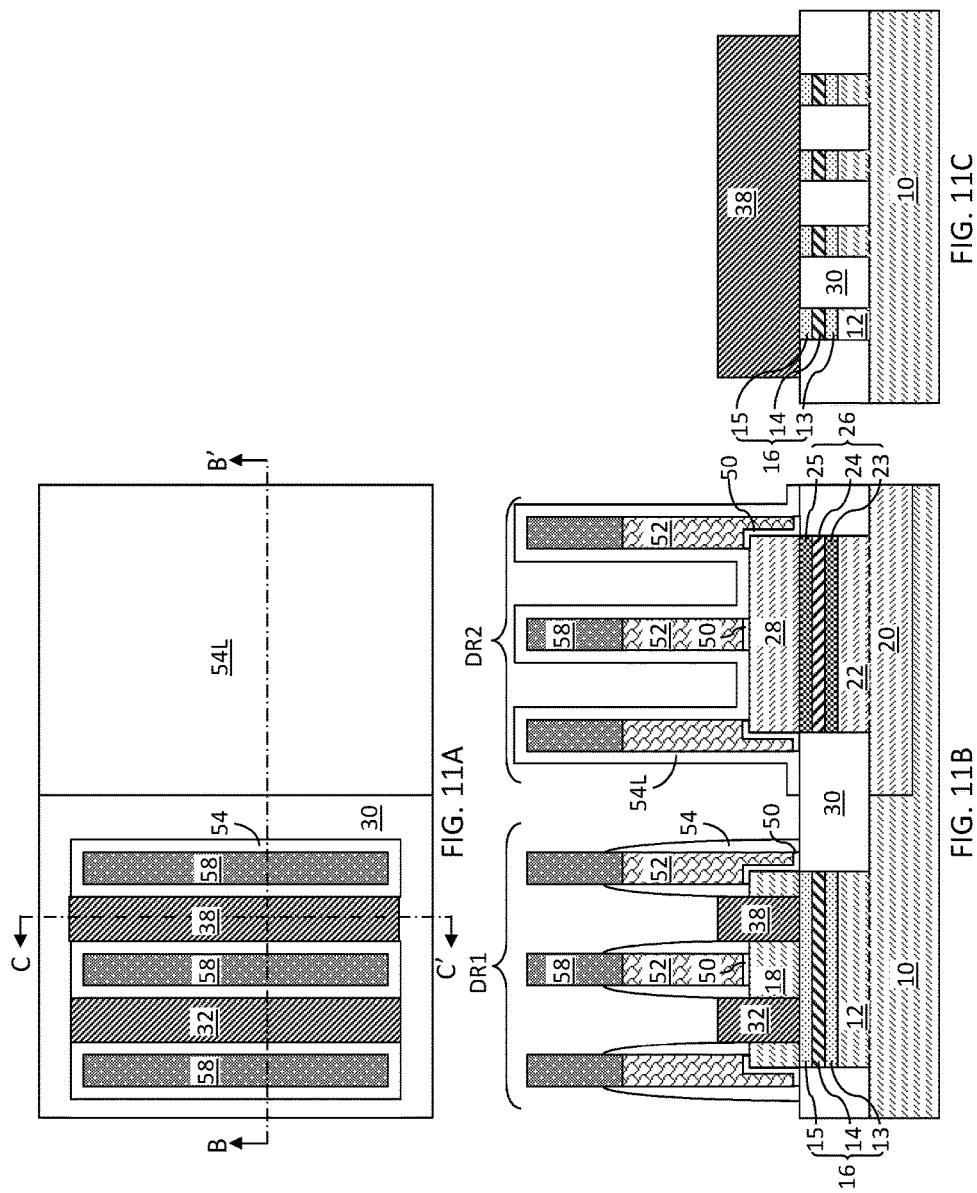
FIG. 11A is a top-down view of the first exemplary semiconductor structure after formation of a first embedded source region and a first embedded drain region according to the first embodiment of the present disclosure.
FIG. 11B is a vertical cross-sectional view of the first exemplary semiconductor structure along the vertical plane B-B' of FIG. 11A.
FIG. 11C is a vertical cross-sectional view of the first exemplary semiconductor structure along the vertical plane C-C' of FIG. 11A.

Referring to FIGS. 11A-11C, first embedded source region 32 and a first embedded drain region 38 can be formed by depositing an additional semiconductor material in the at least one source side cavity 31 and the at least one drain side cavity 37. The additional semiconductor material that forms the first embedded source region 32 and a first embedded drain region 38 can be deposited, for example, by selective epitaxy, in which the additional semiconductor material grows on semiconductor surfaces and does not grow on dielectric surfaces.

The first embedded source region 32 and the first embedded drain region 38 can be doped with dopants of the opposite conductivity type as the first conductivity type for the first device region DR1. The opposite conductivity type of the first conductivity type is herein referred to as a second conductivity type in each device region. Thus, the first conductivity type is n-type and the second conductivity type is p-type in the first device region DR1, while the first conductivity type is p-type and the second conductivity type is n-type in the second device region DR2. The first embedded source region 32 and the first embedded drain region 38 can be doped by in-situ doping, or can be doped by ion implantation. The first embedded source region 32 and the first embedded drain region 38 can extend across a plurality of first-type fin stack structures (12, 16, 18) along a direction parallel to the lengthwise direction of the gate stack structures (50, 52, 58) in the first device region DR1.

Referring to FIGS. 12A-12C, a second dielectric masking layer 56L is deposited over the first exemplary semiconductor structure by a conformal deposition method such as a low pressure chemical vapor deposition (LPCVD). The portion of the second dielectric masking layer 56L in the first device region DR1 can be masked by a patterned photoresist layer (not shown), while the portion of the second dielectric masking layer 56L is physically exposed in the second device region DR2. While the patterned photoresist layer protects the portion of the second dielectric masking layer 56L in the first device region DR1, horizontal portions of the second dielectric masking layer 56L in the second device region DR2 can be removed by an anisotropic etch that employs the patterned photoresist layer as an etch mask. The remaining vertical portions of the second dielectric masking layer 56L forms second gate spacers 56. Each second gate spacer 56 laterally surrounds a gate stack structure (50, 52, 58). The patterned photoresist layer can be removed, for example, by ashing.

A source region and a drain region can be formed on the second-type fin stack structures (22, 26, 28). Specifically, the source region and the drain region can be formed in the sub-portions of the second-type third semiconductor material fin portion 28 that are not covered by the gate stack structures (50, 52, 58) or the second gate spacers 54.

Referring to FIGS. 13A-13C, physically exposed portions of the second-type third semiconductor material fin portion 28 can be removed, for example, by an anisotropic etch in an exemplary processing sequence. Regions of the third semiconductor material from the second-type fin stack structures (22, 26, 28) are removed employing the second gate spacers 28 and the gate stack structure (50, 52, 58) as an etch mask. In one embodiment, the third semiconductor material of the second device region DR2 can be etched employing the top surfaces of the second-type well trapping fin portion 26 as an etch stop surfaces or as endpoint surfaces. In one embodiment, at least one source side cavity (not shown) and at least one drain side cavity (not shown) can be formed in each second-type fin stack structure (22, 26, 28). The remaining portion of each second-type third semiconductor material fin portion 28 as provided at the end of the processing steps of FIGS. 12A-12C can become a plurality of third semiconductor material fin portions 28.

Second embedded source region 42 and a second embedded drain region 48 can be formed by depositing an additional semiconductor material in the at least one source side cavity and the at least one drain side cavity. The additional semiconductor material that forms the second embedded source region 42 and a second embedded drain region 48 can be deposited, for example, by selective epitaxy, in which the additional semiconductor material grows on semiconductor surfaces and does not grow on dielectric surfaces.

The second embedded source region 42 and the second embedded drain region 48 can be doped with dopants of the opposite conductivity type as the first conductivity type for the second device region DR2. The first conductivity type is p-type and the second conductivity type is n-type in the second device region DR2. The second embedded source region 42 and the second embedded drain region 48 can be doped by in-situ doping, or can be doped by ion implantation. The second embedded source region 42 and the second embedded drain region 48 can extend across a plurality of second-type fin stack structures (22, 26, 28) along a direction parallel to the lengthwise direction of the gate stack structures (50, 52, 58) in the second device region DR2.

Referring to FIGS. 14A-14C, a contact-level dielectric layer 80 can be subsequently deposited over the first exemplary semiconductor structure. The contact-level dielectric layer 80 includes a dielectric material such as porous or non-porous organosilicate glass (OSG), silicon oxide, silicon nitride, or a combination thereof. The top surface of the contact-level dielectric layer 80 can be planarized, for example, by chemical mechanical planarization. Various contact via structures are formed through the contact-level dielectric layer 80 employing methods known in the art. The various contact via structures can include, for example, source contact via structures 82, gate contact via structures 85, and drain side contact via structures 88.

Referring to FIGS. 15A and 15B, a second exemplary semiconductor structure according to a second embodiment of the present disclosure can be derived from the first exemplary semiconductor structure of FIGS. 1A and 1B by employing a silicon-germanium alloy layer across the entirety of the first device region DR1 and the second device region DR2 in lieu of a combination of a silicon-carbon alloy layer 16L and a silicon-germanium alloy layer 26L illustrated in FIGS. 2A and 2B. Thus, the silicon-germanium alloy layer of the second embodiment is formed on the top surface of a p-doped semiconductor region and an n-doped semiconductor region. One of the p-doped semiconductor region and the n-doped semiconductor region is the first semiconductor material layer 10, and the other of the p-doped semiconductor region and the n-doped semiconductor region is the doped well 20.

Non-selective or selective epitaxy can be employed to form the silicon-germanium alloy layer of the second embodiment. In one embodiment, the silicon-germanium alloy layer can be formed as an intrinsic (undoped) single crystalline silicon-germanium alloy layer. The silicon-germanium alloy layer can have an atomic concentration of germanium in a range from 1% to 80%, the atomic concentration of silicon being the balance. The thickness of the silicon-germanium alloy layer 26L can be in a range from 10 nm to 100 nm, although lesser and greater thicknesses can also be employed. The material of the silicon-germanium alloy layer 26L, i.e., the silicon-germanium alloy, is the second semiconductor material for the first device region DR1 and the second device region DR2.

N-type dopants are introduced into the portion of the silicon-germanium layer in the first device region DR1 employing a masked ion implantation process. P-type dopants are introduced into the portion of the silicon-germanium alloy layer in the second device region DR2 employing another masked ion implantation process. The species of the n-dopant is selected such that the n-type dopants implanted into the silicon-germanium layer has a lesser diffusivity in the silicon-germanium alloy layer than in the underlying p-doped semiconductor material region, i.e., one of the first semiconductor material of the first semiconductor material layer 10 and the doped well 20 that is present in the first device region DR1. The species of the p-dopant is selected such that the p-type dopants implanted into the silicon-germanium alloy layer has a lesser diffusivity in the silicon-germanium alloy layer than in the underlying n-doped semiconductor material region, i.e., the other of the first semiconductor material of the first semiconductor material layer 10 and the doped well 20 that is present in the second device region DR2.

Within each device region, the conductivity type of the implanted dopants is referred to as a first conductivity type. In the first device region DR1, the first conductivity type is n-type. In the second device region DR2, the second conductivity type is p-type. Within each device region, the dopant of the first conductivity type has a lesser diffusivity in the second semiconductor material, i.e., in the silicon-germanium alloy material, than in the first semiconductor material.

Within each device region, the second semiconductor material layer (which is the silicon-germanium alloy layer) functions a trapping well that provides electrical isolation via a p-n junction for a semiconductor material portion to be subsequently deposited thereupon. Thus, the second semiconductor material layer is herein referred to as a well trapping layer, i.e., a layer that functions as a well providing trapping of electrical charges provided by leakage current, thereby providing electrical isolation of the semiconductor material portion to be subsequently formed. The entirety of each well trapping layer includes the second semiconductor material, i.e., the silicon-germanium alloy.

In one embodiment, an ion implantations process can be performed in the first device region DR1 such that the n-type dopants are implanted into a middle portion of the silicon-carbon alloy layer. The middle portion of the silicon-carbon alloy layer in which the concentration of the implanted n-type dopants is in a range between 10% of the peak atomic concentration and 100% of the peak atomic concentration is herein referred to as an n-doped silicon-germanium alloy layer 94L, which is a doped semiconductor material region including the silicon-germanium alloy material (that is the second semiconductor material) and the n-type dopant (that is the first conductivity type dopant within the first device region DR1). In one embodiment, the n-type dopant is arsenic. The n-type dopant has a lesser diffusivity in the silicon-germanium alloy material than in the first semiconductor material in the first device region DR1 (which can be silicon).

In one embodiment, another ion implantations process can be performed in the second device region DR2 such that the p-type dopants are implanted into a middle portion of the silicon-germanium alloy layer. The middle portion of the silicon-germanium alloy layer in which the concentration of the implanted p-type dopants is in a range between 10% of the peak atomic concentration and 100% of the peak atomic concentration is herein referred to as a p-doped silicon-germanium alloy layer 24L, which is a doped semiconductor material region including the silicon-germanium alloy material (that is the second semiconductor material) and the p-type dopant (that is the first conductivity type dopant within the second device region DR2). In one embodiment, the p-type dopant is boron. The p-type dopant has a lesser diffusivity in the silicon-germanium alloy material than in the first semiconductor material in the second device region DR2 (which can be silicon).

An upper silicon-germanium alloy layer 25L is present above the n-doped silicon-germanium alloy layer 94L and the p-doped silicon-germanium alloy layer 24L. The upper silicon-germanium alloy layer 25L has a vertical dopant concentration of p-type dopants or n-type dopants that exponentially decreases with a vertical distance from the interface with the n-doped silicon-germanium alloy layer 94L or the p-doped silicon-germanium alloy layer 24L. A lower silicon-germanium alloy layer 23L formed below the n-doped silicon-germanium alloy layer 94L and the p-doped silicon-germanium alloy layer 24L. The lower silicon-germanium alloy layer 23L has a vertical dopant concentration that exponentially decreases with a vertical distance from the interface with the n-doped silicon-germanium alloy layer 94L or the p-doped silicon-germanium alloy layer 24L. After an anneal that activates the n-type dopants and the p-type dopants, the thicknesses of the n-doped silicon-germanium alloy layer 94L and the p-doped silicon-germanium alloy layer 24L increase, and the thicknesses of the upper and lower silicon-germanium alloy layers (25L, 23L) decrease.

The thickness of the n-doped silicon-germanium alloy layer 94L can be in a range from 10% to 80% of the thickness of the silicon-carbon alloy layer 16L. The peak atomic concentration of the n-type dopants in the n-doped silicon-germanium alloy layer 94L can be in a range from $1.0 \times 10^{17}/cm^3$ to $1.0 \times 10^{20}/cm^3$, although lesser and greater peak concentrations can also be employed. The thickness of the p-doped silicon-germanium alloy layer 24L can be in a range from 10% to 80% of the thickness of the silicon-germanium alloy layer 26L. The peak atomic concentration of the p-type dopants in the p-doped silicon-germanium alloy layer 24L can be in a range from $1.0 \times 10^{17}/cm^3$ to $1.0 \times 10^{20}/cm^3$, although lesser and greater peak concentrations can also be employed. The silicon-germanium alloy layer includes the n-doped silicon-germanium alloy layer 94L, the p-doped silicon-germanium alloy layer 24L, the upper silicon-germanium alloy layer 25L, and the lower silicon-germanium alloy layer 23L.

The processing steps of FIGS. 4A and 4B, 5A-5C, 6A-6C, 7A-7C, 8A-8C, 9A-9C, 10A-10C, 11A-11C, 12A-12C, 13A-13C, and 14A-14C can be subsequently performed to provide the second exemplary semiconductor structure shown in FIGS. 16A-16C.

The structure of the second device region DR2 of the second exemplary structure in FIGS. 16A-16C is the same as the structure of the first device region DR1 of the first exemplary structure in FIGS. 14A-14C. In the first device region, each first-type well trapping fin portion 16' of the second embodiment replaces a first-type well trapping fin portion 16 of the first embodiment.

Specifically, first-type well trapping fin portion 16' is a fin portion that includes a trapping well and is located within the first device region DR1. Each first-type well trapping fin portion 16' includes an n-doped silicon-germanium alloy fin portion 94, an upper silicon-germanium alloy fin portion 25, and a lower silicon-germanium alloy fin portion 23. Each n-doped silicon-germanium alloy fin portion 94 is a remaining portion of the n-doped silicon-germanium alloy layer 94L. Each upper silicon-germanium alloy fin portion 25 is a remaining portion of the upper silicon-germanium alloy layer 25L. Each lower silicon-germanium alloy fin portion 23 is a remaining portion of the lower silicon-germanium alloy layer 23L. Each patterned upper portion of the first semiconductor material region within the first device region is herein referred to as a first-type first semiconductor material fin portion 12. The first-type first semiconductor material fin portion 12 can be a patterned portion of an upper portion of the first semiconductor material layer 10, or can be a patterned portion of the upper portion of the doped well 20.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
   a semiconductor substrate including a first semiconductor material; and
   a fin stack structure located on said semiconductor substrate and having a pair of substantially vertical parallel sidewalls, said fin stack structure comprising:
      a first semiconductor material fin portion comprising said first semiconductor material and located over said semiconductor substrate;
      a well trapping fin portion located over said first semiconductor material fin portion and containing a doped semiconductor material region that includes a second semiconductor material different from said first semiconductor material and a dopant of a first conductivity type; and
      at least one third semiconductor material fin portion comprising a third semiconductor material and located over said well trapping fin portion; and
   a semiconductor material portion located over said well trapping fin portion and having a doping of a second conductivity type that is the opposite of said first conductivity type;
   a functional gate structure straddling over a portion of said at least one third semiconductor material fin portion, wherein said functional gate structure is spaced apart from said well trapping fin portion; and
   a gate spacer located on sidewalls of said functional gate structure, wherein sidewall surfaces of said gate spacer are vertically aligned to sidewall surfaces of said at least one third semiconductor material fin portion.

2. The semiconductor structure of claim 1, wherein said dopant of said first conductivity type has a lesser diffusivity in said second semiconductor material than in said first semiconductor material or in said third semiconductor material.

3. The semiconductor structure of claim 2, wherein said second semiconductor material is a silicon-germanium alloy, and said dopant of said first conductivity type is boron or arsenic.

4. The semiconductor structure of claim 2, wherein said second semiconductor material is a silicon-carbon alloy, and said dopant of said first conductivity type is arsenic or phosphorus.

5. The semiconductor structure of claim 1, wherein said semiconductor substrate is a bulk semiconductor substrate including said first semiconductor material throughout.

6. The semiconductor structure of claim 1, wherein said first semiconductor material is single crystalline silicon, a single crystalline silicon-germanium alloy or a single crystalline silicon-carbon alloy.

7. The semiconductor structure of claim 1, further comprising a shallow trench isolation structure laterally surrounds the first-type fin stack structure.

8. The semiconductor structure of claim 7, wherein said shallow trench isolation structure has a topmost surface that is located beneath a topmost surface of said first-type fin stack structure.

9. The semiconductor structure of claim 8, wherein said topmost surface of said shallow trench isolation structure is coplanar with an interface between said well trapping fin portion and said third semiconductor material fin portion.

10. The semiconductor structure of claim 1, wherein said well trapping fin portion comprises a lower well trapping fin portion, a middle well trapping fin portion and an upper well trapping fin portion.

11. The semiconductor structure of claim 10, wherein said dopant of said second conductivity type is greatest in said middle well trapping fin portion, said dopant concentration in said lower well trapping portion decreases exponentially from a vertical distance of an interface with said middle well trapping portion, and said dopant concentration in said upper well trapping decreases exponentially from a vertical distance of an interface with said middle well trapping portion.

12. The semiconductor structure of claim 1, wherein said semiconductor material portion is an embedded source/drain region, and wherein said embedded source/drain region is located on opposing sidewalls of said third semiconductor material fin portion and located over the well trapping fin portion.

13. The semiconductor structure of claim 12, further comprising a contact level dielectric material located over each embedded source/drain region and said functional gate structure, wherein a first contact structure is present in the contact level dielectric material and directly contacting one of said first embedded source/drain regions, and a second contact structure is present in the contact level dielectric material and directly contacting another of said embedded source/drain regions.

14. A semiconductor structure comprising:
   a semiconductor substrate including a first semiconductor material; and
   a fin stack structure located on said semiconductor substrate and having a pair of substantially vertical parallel sidewalls, said fin stack structure comprising:

a first semiconductor material fin portion comprising said first semiconductor material and located over said semiconductor substrate;

a well trapping fin portion located over said first semiconductor material fin portion and containing a doped semiconductor material region that includes a second semiconductor material different from said first semiconductor material and a dopant of a first conductivity type; and at least one third semiconductor material fin portion comprising a third semiconductor material and located over said well trapping fin portion; and a semiconductor material portion located over said well trapping fin portion and having a doping of a second conductivity type that is the opposite of said first conductivity type, wherein said well trapping fin portion comprises a lower well trapping fin portion, a middle well trapping fin portion and an upper well trapping fin portion, and wherein said dopant of said second conductivity type is greatest in said middle well trapping fin portion, said dopant concentration in said lower well trapping fin portion decreases exponentially from a vertical distance of an interface with said middle well trapping fin portion, and said dopant concentration in said upper well trapping fin portion decreases exponentially from a vertical distance of an interface with said middle well trapping fin portion.

\* \* \* \* \*